(12) United States Patent
Yabuta et al.

(10) Patent No.: US 7,829,444 B2
(45) Date of Patent: Nov. 9, 2010

(54) FIELD EFFECT TRANSISTOR MANUFACTURING METHOD

(75) Inventors: Hisato Yabuta, Machida (JP);
Masafumi Sano, Yokohama (JP);
Tatsuya Iwasaki, Machida (JP); Hideo Hosono, Yokohama (JP); Toshio Kamiya, Yokohama (JP); Kenji Nomura, Yokohama (JP)

(73) Assignees: Canon Kabushiki Kaisha, Tokyo (JP);
Tokyo Institute of Technology, Tokyo (JP)

( * ) Notice: Subject to any disclaimer, the term of this patent is extended or adjusted under 35 U.S.C. 154(b) by 389 days.

(21) Appl. No.: 11/269,641

(22) Filed: Nov. 9, 2005

(65) Prior Publication Data

US 2006/0110867 A1 May 25, 2006

(30) Foreign Application Priority Data

Nov. 10, 2004 (JP) .............................. 2004-326686

(51) Int. Cl.
*H01L 21/20* (2006.01)

(52) U.S. Cl. ...................... 438/483; 438/482; 438/485; 257/E21.497

(58) Field of Classification Search ................ 438/151, 438/197, 482, 485, 483; 257/43, 57, E21.497
See application file for complete search history.

(56) References Cited

U.S. PATENT DOCUMENTS

| 5,635,408 | A | 6/1997 | Sano et al. .................... 437/4 |
|---|---|---|---|
| 6,075,256 | A | 6/2000 | Kaifu et al. .................... 257/53 |
| 6,379,994 | B1 | 4/2002 | Sano et al. .................... 438/96 |
| 7,132,373 | B2 * | 11/2006 | Fukuhisa et al. ............. 438/778 |
| 7,189,992 | B2 | 3/2007 | Wager, III et al. .............. 257/43 |
| 7,297,977 | B2 * | 11/2007 | Hoffman et al. ............... 257/43 |
| 2003/0003621 | A1 * | 1/2003 | Rhodes et al. ............... 438/104 |
| 2003/0218222 | A1 | 11/2003 | Wager, III et al. ........... 257/430 |
| 2004/0259383 | A1 * | 12/2004 | Choi et al. ................... 438/785 |
| 2005/0173734 | A1 | 8/2005 | Yoshioka et al. ............. 257/202 |
| 2005/0199959 | A1 * | 9/2005 | Chiang et al. ................ 257/368 |
| 2006/0052641 | A1 * | 3/2006 | Funahashi .................... 564/426 |
| 2006/0079037 | A1 * | 4/2006 | Hoffman et al. ............. 438/158 |
| 2006/0108529 | A1 | 5/2006 | Saito et al. ................ 250/338.4 |

(Continued)

FOREIGN PATENT DOCUMENTS

JP          05-251705          9/1993

(Continued)

OTHER PUBLICATIONS

Narushima, A p-type amorphous oxide semiconductor and room temperature fabrication of amorphous oxide p-n heterojunction diodes, Adv. Mat. 15, 2003, 1409-1413.*

(Continued)

*Primary Examiner*—Kiesha R Bryant
*Assistant Examiner*—Minchul Yang
(74) *Attorney, Agent, or Firm*—Fitzpatrick, Cella, Harper & Scinto

(57) ABSTRACT

Provided is a novel method for manufacturing a field effect transistor. Prior to forming an amorphous oxide layer on a substrate, ultraviolet rays are irradiated onto the substrate surface in an ozone atmosphere, plasma is irradiated onto the substrate surface, or the substrate surface is cleaned by a chemical solution containing hydrogen peroxide.

3 Claims, 6 Drawing Sheets

U.S. PATENT DOCUMENTS

| | | | |
|---|---|---|---|
| 2006/0113536 A1 | 6/2006 | Kumomi et al. | 257/57 |
| 2006/0113539 A1 | 6/2006 | Sano et al. | 257/59 |
| 2006/0113565 A1 | 6/2006 | Abe et al. | 257/197 |
| 2006/0150891 A1* | 7/2006 | Ichinose et al. | 117/2 |

FOREIGN PATENT DOCUMENTS

| | | |
|---|---|---|
| JP | 08-032094 | 2/1996 |
| JP | 2000-44236 | 2/2000 |
| JP | 2003-298062 | 10/2003 |
| JP | 2004-103957 | 4/2004 |
| WO | WO 03/098699 | 11/2003 |
| WO | WO 2004/038757 | 5/2004 |
| WO | WO 2005/088726 | 9/2005 |
| WO | WO 2005/093846 | 10/2005 |
| WO | WO 2005/093847 | 10/2005 |
| WO | WO 2005/093848 | 10/2005 |
| WO | WO 2005/093849 | 10/2005 |
| WO | WO 2005/093850 | 10/2005 |
| WO | WO 2005/093851 | 10/2005 |
| WO | WO 2005/093852 | 10/2005 |
| WO | WO 2006/051993 | 5/2006 |
| WO | WO 2006/051994 | 5/2006 |
| WO | WO 2006/051995 | 5/2006 |

OTHER PUBLICATIONS

Orita, (Philosophical Magazine, B81, 2001, pp. 501-515), Amorphous transparent conductive oxide InGaO3(ZnO)m: a Zn 4s conductor.*

"Carrier Transport in Transparent Amorphous Oxide Semiconductor InGaZnO$_4$", Nomura et al.; Preprint 31a-ZA-6 of 51th Meeting of Union of applied Phys. Soc., Mar. 2004, Tokyo University of Technology.

"Room Temperature Fabrication and Carrier Transport . . . (>10 cm$^2$/Vs)", Kamiya et al. ; Preprint 1a-F-5 of 65$^{th}$ Meeting of Appl. Phys. Soc., Sep. 2004, Tohoku Gakuen University.

Nomura et al., "Room-temperature Fabrication of Transparent Flexible Thin-film Transistors Using Amorphous Oxide Semiconductors," *Nature*, vol. 432, 488-492 (2004).

Takagi et al., "Carrier Transport and Electronic Structure in Amorphous Oxide Semiconductor, a-InGaZnO$_4$," *Thin Solid Films*, vol. 486, 38-41 (2005).

Nomura et al., "Thin-Film Transistor Fabricated in Single-Crystalline Transparent Oxide Semiconductor," *Science*, vol. 300, 1269-1272 (2003).

* cited by examiner

FIELD EFFECT TRANSISTOR MANUFACTURING METHOD

BACKGROUND OF THE INVENTION

1. Field of the Invention

The present invention relates to a method for manufacturing a field effect transistor.

2. Related Background Art

In recent years, flat image display devices (Flat Panel Display: FPD) have been developed for practical use as a result of the progress made in technologies such as liquid crystals and electroluminescence (EL). These FPDs are driven by the active matrix circuitry of field effect thin-film transistors (Thin Film Transistor: TFT) which use an amorphous silicon thin-film or a polycrystalline thin-film on a glass substrate in the active layer.

Meanwhile, testing is being carried out into the use of resin substrates which are light-weight and flexible in place of a glass substrate in order to make such FPDs even thinner, lighter and have better their shatter resistance.

However, the manufacture of such an above-described transistor which uses a silicon thin-film requires a relatively high temperature thermal process, whereby direct formation onto a resin substrate, which usually has a low thermal resistance, is difficult.

Therefore, development is being actively conducted into TFTs which are capable of deposition at low temperatures and which use, for example, ZnO as a material for the oxide semiconductor thin-film (Japanese Patent Application Laid-Open No. 2003-298062).

From the knowledge of the present inventors that ZnO cannot generally form a stable amorphous phase, existing mainly in a polycrystalline phase, carriers would therefore be scattered at the interface between polycrystalline particles. As a result of this fact, it was learned that electron mobility cannot be increased.

That is, a method has been sought for producing an amorphous oxide which can be preferably used in the active layer of a field effect transistor.

SUMMARY OF THE INVENTION

In consideration of the above-described background, it is an object of the present invention to provide a method for manufacturing a novel field effect transistor.

The present invention will now be explained in further detail.

First Aspect of the Present Invention

Deposition Pre-Treatment to Deposition Post-Treatment

The method for manufacturing a field effect transistor according to the present invention comprises:
a first step of preparing a substrate; and
a second step of forming on the substrate an active layer comprising an amorphous oxide; wherein
prior to the second step, at least one of:
a step of irradiating ultraviolet rays onto the substrate surface in an ozone atmosphere; or
a step of irradiating plasma onto the substrate surface; or
a step of cleaning the substrate surface with a chemical solution containing hydrogen peroxide is carried out.

Further, the method for manufacturing a field effect transistor according to the present invention comprises:
a first step of preparing a substrate; and
a second step of forming on the substrate an active layer comprising an amorphous oxide; wherein
the second step is carried out in an atmosphere comprising at least one selected from the group consisting of ozone gas, nitrogen oxide gas, an oxygen-containing radical, elemental oxygen, oxygen ion and an oxygen radical.

Further, the method for manufacturing a field effect transistor according to the present invention comprises:
a first step of preparing a substrate; and
a second step of forming on the substrate an active layer comprising an amorphous oxide; wherein
subsequent to the second step, the method comprises at least one step of:
a step of thermal processing at a higher temperature than the deposition temperature of the active layer in the second step; and
a step of irradiating an oxygen-containing plasma onto the substrate comprising the active layer.

The present invention also comprises, subsequent to the second step, at least one of the steps of: thermal processing; irradiating oxygen-containing plasma onto the oxide film; mask deposition for patterning of the film; and etching for patterning of the film.

The present invention also comprises, subsequent to the second step, subjecting the substrate comprising an amorphous oxide to:
thermal processing in an atmosphere containing ozone; or
thermal processing in an atmosphere containing nitrogen oxide; or
thermal processing in an atmosphere containing water vapor.

The present invention also comprises, subsequent to the second step, subjecting the substrate comprising an amorphous oxide to:
thermal processing in an atmosphere containing an oxygen radical;
irradiating an oxygen-containing plasma onto the amorphous oxide; or
irradiating oxygen-containing plasma onto the amorphous oxide in a state wherein the substrate has been heated.

The present invention also comprises, subsequent to the second step, subjecting the amorphous oxide to:
irradiation with an oxygen-containing radical beam; or
mask deposition for patterning of the amorphous oxide; or
an etching step for patterning of the amorphous oxide.

Second Aspect of the Present Invention

Deposition (or Film Formation) Method

The method for manufacturing a field effect transistor according to the present invention comprises:
a first step of preparing a substrate; and
a second step of forming on the substrate an active layer comprising an amorphous oxide; wherein
the second step is carried out by:
resistance heating deposition; or
electron beam deposition; or
chemical vapor deposition; or
line-beam laser deposition; or
electrodeposition.

Resistance heating deposition can include, for example, resistance heating deposition using a Knudsen cell. Chemical vapor deposition includes methods having means for promoting source material decomposition by plasma, as well as means for promoting source material decomposition by a catalyst.

Third Aspect of the Present Invention

Substrate Temperature

The method for manufacturing a field effect transistor according to the present invention comprises:
a first step of preparing a substrate; and
a second step of forming on the substrate an active layer comprising an amorphous oxide; wherein
the second step is carried out at a deposition temperature of 70° C. or more.

A lower limit for the deposition temperature may be set as appropriate, although preferably it is lower than the thermal deformation temperature of the substrate.

Here, the thermal deformation temperature is, for example, from 100° C. to 200° C., inclusive thereof. Therefore, the above-described deposition temperature is preferably 70° C. or more to 200° C. or less.

The amorphous oxide produced in the above three aspects of the present invention is characterized, for example, in having an electron carrier density of less than $1 \times 10^{18}/cm^3$, or, in being an amorphous oxide in which electron mobility tends to increase as electron carrier density increases.

Such an amorphous oxide is an oxide comprising at least one of In, Zn and Sn, or, is an oxide comprising In, Zn and Ga.

The above-described first to third aspects of the present invention may include a separate step in between the first and second steps. In the present invention, while "depositing an amorphous oxide on a substrate" obviously includes direct deposition onto the substrate, this phrase also includes deposition of the amorphous oxide onto the substrate via another layer(s).

According to the present invention, a method for manufacturing a novel field effect transistor comprising an amorphous oxide is provided.

DESCRIPTION OF THE PREFERRED EMBODIMENTS

Figure 1:
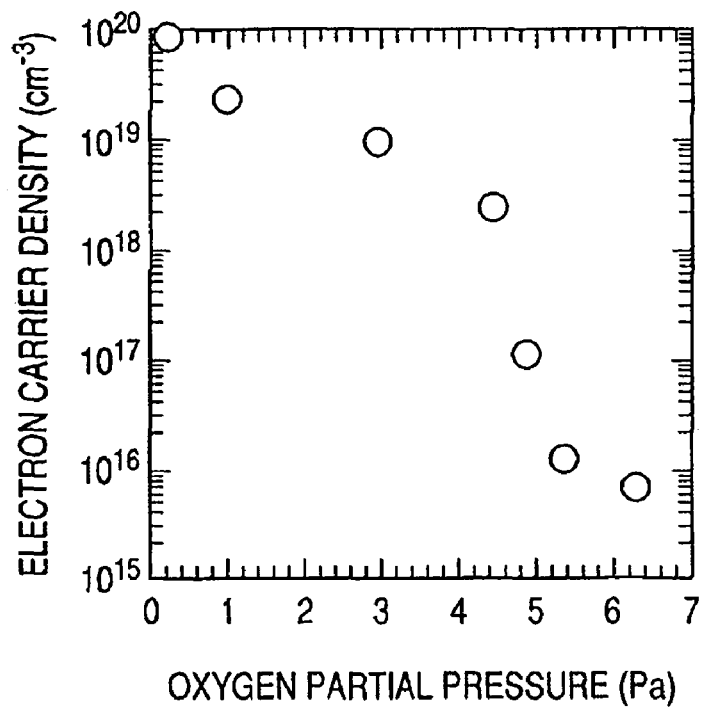
FIG. 1 is a graph illustrating the relationship between the electron carrier density of an In—Ga—Zn—O system amorphous film deposited by pulsed laser deposition and the oxygen partial pressure during deposition.

First, the above-described first to third aspects of the present invention will be explained with reference to a first, second and third embodiment.

After this explanation, the amorphous oxide according to the present invention and matters common to each of the embodiments will be described.

First Embodiment

Pre-Deposition to Post-Deposition

1-A The method for manufacturing a field effect transistor according to the present embodiment is characterized by, subsequent to preparing a substrate yet prior to forming on the substrate an active layer comprising an amorphous oxide, carrying out any of the following steps:
irradiating ultraviolet rays onto the substrate surface in an ozone atmosphere; or
irradiating plasma onto the substrate surface; or
cleaning the substrate surface with a chemical solution containing hydrogen peroxide; or
coating with a film comprising silicon and oxygen.

As a result of the above surface treatment process of the substrate, contaminants adhered to the substrate surface are removed, whereby the substrate surface is cleaned.

As a result of the above process, performance deterioration due to contaminants diffusing into the film constituting a TFT (thin-film transistor), or other such field effect transistor, can be reduced.

Further, as a result of removing adhered matter from the substrate surface, adhesion between the substrate and the film constituting the transistor can be improved.

1-B The method for manufacturing a field effect transistor according to the present invention is characterized by, subsequent to preparing a substrate to be used for deposition, depositing an amorphous oxide in a prescribed atmosphere.

Such a prescribed atmosphere comprises at least one selected from the group consisting of ozone gas, nitrogen oxide gas, an oxygen-containing radical, elemental oxygen, oxygen ion and an oxygen radical.

The ozone gas, nitrogen oxide gas, an oxygen-containing radical, and oxygen radical can be fed into the deposition chamber from outside of the deposition chamber.

By irradiating an oxygen-containing plasma onto the substrate, elemental oxygen, oxygen ion and oxygen radicals can be generated in the deposition chamber.

Since the above-described ozone gas etc. is more strongly oxidative than oxygen in a molecular state, such substances are suitable when trying to obtain an amorphous oxide which has little oxygen deficiency.

When the above-described amorphous oxide is used as the active layer of a field effect transistor, according to above-described present invention, unnecessary oxygen deficiency can be reduced, whereby deterioration in transistor characteristics due to defect level formation can be suppressed.

The present invention also encompasses the case where the amorphous oxide is used as an insulating layer. If the insulating layer is formed in accordance with the above-described method, the advantageous effect that the insulating properties increase can be achieved.

The present invention further encompasses the case where during amorphous oxide deposition oxygen molecules are also incorporated into the above-described atmosphere.

1-C The present invention is also characterized in carrying out, subsequent to preparing a substrate (first step) and a second step of forming on the substrate an active layer comprising an amorphous oxide, at least one step (post-treatment step) of the below-described post-treatment steps.

That is, a step of thermal processing at a higher temperature than the deposition temperature of the active layer in the second step; or a step of irradiating an oxygen-containing plasma onto the substrate comprising the active layer.

The deposition temperature is, for example, room temperature. Specifically, the deposition temperature is in the range of 0° C. to 40° C.

In some cases, such as when performing deposition at room temperature, deposition is intentionally carried out without heating the substrate during deposition of the active layer.

The above-described thermal processing step can be carried out as appropriate as long as such step is after amorphous oxide formation.

Obviously, the thermal processing step can be carried out after the gate insulating film has been formed on the substrate, or after the electrode films (the drain electrode, source electrode, gate electrode etc.) have been formed.

In particular, when an oxide is used as the above-described electrode film, it is preferable to carry out the thermal processing step after electrode film formation.

The thermal processing step can be carried out in an ozone-containing atmosphere, a nitrogen oxide-containing atmosphere, a water vapor-containing atmosphere, an oxygen radical-containing atmosphere and the like.

The temperature in the thermal processing step is, for example, greater than room temperature and 600° C. or less. Preferably, the temperature is 200° C. or less. When a flexible substrate such as PET (polyethylene terephthalate) is used, the temperature is 200° C. or less, preferably 100° C. or less, and more preferably 50° C. or less.

According to the above, unnecessary oxygen deficiency can be reduced, whereby deterioration of transistor characteristics due to defect level formation can be reduced.

When an insulating layer comprising an oxide is formed on the substrate, the insulating properties thereof can be increased.

In addition, the step of irradiating an oxygen-containing plasma may be carried out as appropriate, as long as such step is after amorphous oxide formation.

Specifically, this refers to after the amorphous oxide active layer deposition, after gate insulating film deposition (when using an oxide for the gate insulating film), or after electrode film deposition (when using an oxide for the drain electrode, source electrode, or gate electrode).

Plasma irradiation can also be carried out while heating the substrate.

As a result of such plasma irradiation, unnecessary oxygen deficiency can be reduced, whereby deterioration of transistor characteristics due to defect level formation can be suppressed. Further, when an insulating layer is comprised on the substrate, insulating properties can be increased.

Furthermore, after the second step, the formed film can be subjected to patterning in order to construct a field effect transistor such as a TFT.

Specifically, a mask layer to be used for patterning is deposited. Alternatively, after the film has been deposited, etching can be carried out after undergoing resist coating and lithography steps.

By carrying out the above, the number of steps during TFT device formation can be reduced, whereby circuitry and devices can be obtained having little variation in characteristics between devices.

Second Aspect of the Present Invention

Deposition Method

The method for manufacturing a field effect transistor according to the present embodiment comprises:
preparing a substrate (first step), followed by a second step of forming on the substrate an active layer comprising an amorphous oxide, wherein the second step is carried out by:
resistance heating deposition; or
electron beam deposition; or
chemical vapor deposition; or
line-beam laser deposition; or
electrodeposition.

The present invention encompasses preparing a substrate, followed by, when forming on the substrate at least one selected from the group consisting of an amorphous oxide active layer of a field effect transistor, a source electrode, a drain electrode, a gate insulating film and a gate electrode, forming by the above-mentioned resistance heating deposition, electron beam deposition, chemical vapor deposition, line-beam laser deposition or electrodeposition.

From this, an active layer, an electrode film or an insulating film can be obtained having equal to or better quality than that of conventional pulsed laser deposition. Further, according to the invention in accordance with the present embodiment, the amorphous oxide can be deposited onto a substrate having the same or greater surface area than that of a sputtering technique.

Although it depends on the apparatus used to carry out deposition, the conditions relating to oxygen (e.g. oxygen partial pressure) when depositing an amorphous oxide by the above-described techniques can be set, for example, in the below range.

For resistance heating deposition and electron beam deposition, the oxygen partial pressure or the total pressure is set in the range of from $10^{-3}$ to 10 Pa.

For chemical vapor deposition, half of the chamber internal total pressure, for example, can be set as the oxygen partial pressure. For line-beam laser deposition, the oxygen partial pressure range can be set, for example, from 4.5 Pa to less than 6.5 Pa.

Line-beam laser deposition is a deposition technique which uses a laser employed in pulsed laser deposition (described below), to which a line optical system is attached for generating a laser line beam having a prescribed width.

Third Aspect of the Present Invention

Substrate Temperature

The method for manufacturing a field effect transistor according to the present embodiment comprises preparing a substrate (first step), and carrying out deposition at a deposition temperature of 70° C. or higher during a second step of forming on the substrate an active layer comprising an amorphous oxide.

Here, the term deposition temperature refers to, for example, the temperature of the substrate, the temperature of the uppermost surface of the substrate (the surface on which the film is being grown), the temperature near the substrate, or the temperature indicated by a chamber internal thermometer installed in the respective film deposition apparatus.

Therefore, even when deposition is carried out with the atmosphere temperature set to room temperature (e.g. using a heater, or especially when conducting deposition without heating), cases where the temperature of the substrate itself or the temperature of the uppermost surface of the substrate is 70° C. or higher are within the range of the invention according to the present embodiment.

The lower limit for the deposition temperature (e.g. substrate temperature) may be set as appropriate, although preferably it is lower than the thermal deformation temperature of the substrate, for example.

Although the thermal deformation temperature is dependent on the substrate, it is from 100° C. or more to 200° C. or less (inclusive thereof), for example.

By setting the deposition temperature (e.g. substrate temperature) during deposition to 70° C. or higher, variation in film characteristics, which occurs in processes subsequent to formation of the amorphous oxide, is less likely to happen, which ultimately results in reduced variation in the device characteristics. Here, examples of device characteristics include electron mobility, on/off ratio, voltage between drain and source, gate threshold voltage and the like, which exist in a transistor fabricated using the above-described amorphous oxide.

Further, the reason for setting the temperature to 70° C. or higher is because, when using an amorphous oxide to form the transistors for a display apparatus or similar device, there are cases where in subsequent processes heating to about 60° C. is carried out, or the device heats up during use to about 60° C.

In addition, the stability of the device improves during high-temperature operation or after high-temperature environment storage. This concept is illustrated in FIGS. 7A and 7B.

Figure 7A:
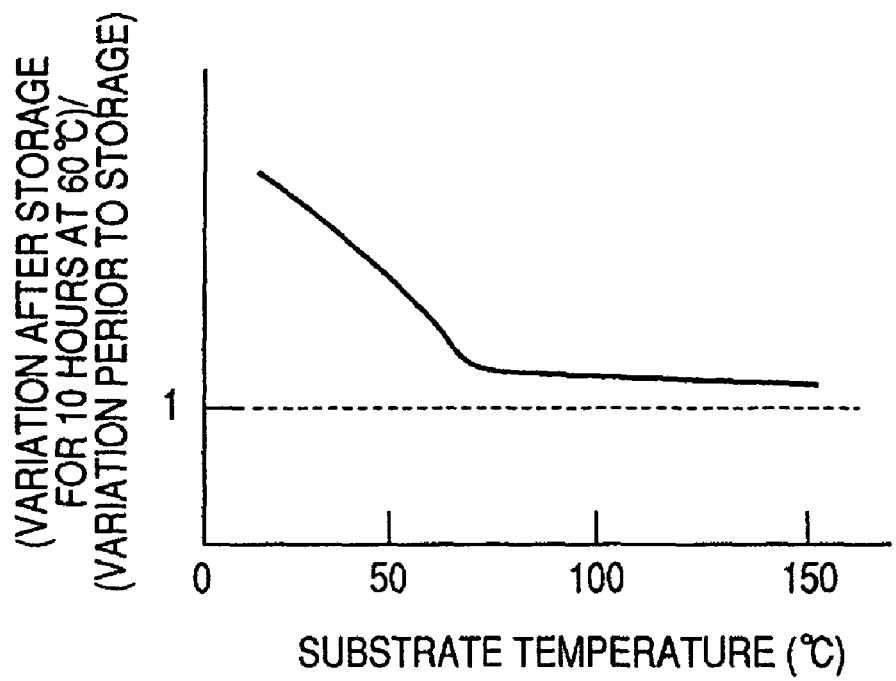
FIG. 7A is a schematic diagram for explaining the third aspect of the present invention.
Figure 7B:
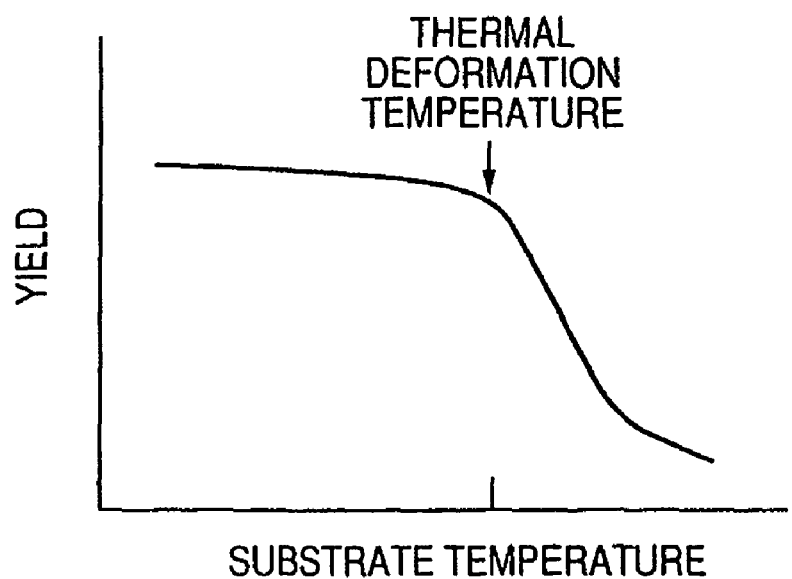
FIG. 7B is a schematic diagram for explaining the third aspect of the present invention.

FIG. 7A illustrates the relationship between a typical (variation in device characteristics after storage for 10 hours at 60° C.)/(variation in device characteristics before storage) on the vertical axis, and substrate temperature during deposition of the amorphous oxide on the horizontal axis. It can be seen that if the temperature is set to 70° C. or higher, the variation in characteristics decreases.

A preferable range for the substrate temperature will depend on the deposition method and deposition techniques. However, although since in a sputtering method high-energy particles are irradiated onto the substrate surface, a sputtering method is a preferable deposition method as deposition is good at even comparatively low temperatures.

Here, although strictly speaking "substrate temperature" refers to the temperature of the substrate surface during deposition, in cases where it is difficult to directly measure the temperature during deposition, the temperature can be taken to be the average value of the substrate temperature prior to deposition and the substrate temperature immediately after deposition. Substrate temperature may be measured using an arbitrary thermometer, such as a radiation thermometer or a thermocouple.

The deposition temperature (e.g. substrate temperature) is preferably lower than that of the substrate thermal deformation temperature. Especially in cases where a resin substrate is used, and when deposition is carried out at a higher temperature than the thermal deformation temperature, film separation and film damage can occur.

That is, fabrication yield decreases. FIG. 7B is a schematic diagram illustrating the relationship between yield on the vertical axis and substrate temperature during deposition on the horizontal axis. It can be seen that yield decreases if the substrate temperature is set higher than the thermal deformation temperature.

Using a substrate which has a substrate thermal deformation temperature of 100° C. or more to 200° C. or less is preferable from the viewpoint of device stability and substrate flexibility.

The deposition temperature (e.g. substrate temperature) in the invention according to the present embodiment is preferably 70° C. or more to 200° C. or less, and more preferably from 70° C. or more to 100° C. or less, although this does depend on the kind of substrate that is used.

Further, in terms of fabricating a TFT on a flexible substrate, preferable conditions include using a material with a substrate deformation temperature of between about 120 to 150° C., and depositing at a substrate temperature of about 80 to 100° C.

The thermal deformation temperature of typical resin substrates is about 75° C. for acrylic resin (PMMA), 70° C. for PET and 150° C. for PC (polycarbonate), although the temperature will vary depending on factors such as the production method and the mixture. For example, by strengthening with glass fiber or similar, materials do exist which have their deformation temperature raised to about 200° C., even for PET based materials.

Here, thermal deformation temperature can be evaluated in accordance with JIS K7206 testing standards.

A glass substrate, plastic substrate or a plastic film substrate can be used as a substrate to be formed with a transparent film. The kinds of plastic which can be used include an arbitrary resin such as polyethylene terephthalate (PET), polyimide, acryl (PMMA), epoxy and the like.

It is noted that in addition to the deposition method explained for the second embodiment, the deposition method according to the present embodiment can also be appropriately selected from among, for example, pulsed laser deposition (PLD) and sputtering (SP).

The amorphous oxide which can be applied in the above-describe first to third embodiments will now be explained.

(Amorphous Oxide)

The electron carrier density of the amorphous oxide according to the present invention is the value when measured at room temperature. Room temperature is, for example, 25° C., and more specifically can be selected as appropriate from the range of about 0° C. to 40° C. The electron carrier density of the amorphous oxide according to the present invention does not have to be less than $10^{18}/cm^3$ over the whole range of 0° C. to 40° C. For instance, it is acceptable if electron carrier density is less than $10^{18}/cm^3$ at 25° C. If electron carrier density is further decreased to $1 \times 10^{17}/cm^3$ or less, and more preferably $1 \times 10^{16}/cm^3$ or less, a normally-off TFT can be obtained at a good yield.

Additionally, the "less than $10^{18}/cm^3$" means preferably less than $1 \times 10^{18}/cm^3$, and more preferably less than $1.0 \times 10^{18}/cm^3$.

Measurement of electron carrier density can be obtained from the Holl effect measurement.

In the present invention the term "amorphous oxide" refers to an oxide in which a halo pattern can be observed and does not show a specific diffraction line in its X-ray diffraction spectrum.

The lower limit of the electron carrier density for the amorphous oxide according to the present invention is not particularly restricted, as long as the amorphous oxide can be employed as the channel layer of a TFT. The lower limit is, for example $1 \times 10^{12}/cm^3$.

Accordingly, in the present invention electron carrier density is set at, for example, $1 \times 10^{12}/cm^3$ or more to less than $1 \times 10^{18}/cm^3$ by controlling the materials, composition ratio, production conditions and similar factors of the amorphous oxide, as shown in the below Examples. More preferable is the range of $1 \times 10^{13}/cm^3$ or more to $1 \times 10^{17}/cm^3$ or less, and still more preferable is the range of from $1 \times 10^{15}/cm^3$ or more to $1 \times 10^{16}/cm^3$ or less.

In addition to InZnGa oxide, the amorphous oxide can also be appropriately selected from among In oxides, $In_xZn_{1-x}$ oxides ($0.2 \leq x \leq 1$), $In_xSn_{1-x}$ oxides ($0.8 \leq x \leq 1$), or $In_x(Zn, Sn)_{1-x}$ oxides ($0.15 \leq x \leq 1$).

$In_x(Zn,Sn)_{1-x}$ oxide can also be written as $In_x(Zn_ySn_{1-y})_{1-x}$ oxide, wherein the range of y is from 1 to 0.

For the case of an indium oxide which does not contain zinc or tin, a part of the indium may be substituted with gallium (i.e. the case of $In_xGa_{1-x}$ oxide ($0 \leq x \leq 1$)).

Amorphous oxides having an electron carrier density of less than $1 \times 10^{18}/cm^3$ which the present inventors were successful in fabricating will now be explained.

One of the above oxides comprised In—Ga—Zn—O, wherein the composition of its crystalline state can be expressed as $InGaO_3(ZnO)_m$ (m is a natural number of less than 6), characterized in that the electron carrier density was less than $1 \times 10^{18}/cm^3$.

Another of the above oxides comprised In—Ga—Zn—Mg—O, wherein the composition of its crystalline state can be expressed as $InGaO_3(Zn_{1-x}Mg_xO)_m$ (m is a natural number of less than 6; $0 \leq x \leq 1$), characterized in that the electron carrier density was less than $1 \times 10^{18}/cm^3$.

It is preferable that the electron mobility in the film constituted from these oxides is designed to exceed 1 $cm^2/(V \cdot sec)$.

If the above-described film is used for the channel layer, transistor characteristics can be realized wherein the gate current when the transistor is off is a normally-off of less than 0.1 microamperes, and the on/off ratio is more than $10^3$. Further, such layer is transparent or translucent with respect to visible light, whereby a flexible TFT can be realized.

The above-described film is characterized by the fact that electron mobility increases in conjunction with an increase in the number of electrons being conducted. A glass substrate, plastic substrate or a plastic film substrate can be used as a substrate to be formed with a transparent film.

When the above-described amorphous oxide is employed for the channel layer, at least one of $Al_2O_3$, $Y_2O_3$, or $HfO_2$, or a mixed compound consisting of at least two thereof, can be applied as the gate insulating film.

Further, intentionally not dosing into the amorphous oxide impurity ions for increasing electric resistance, and carrying out deposition in an atmosphere containing oxygen gas is also a preferable embodiment.

The present inventors discovered the unique characteristic that, in this semi-insulating oxide amorphous thin-film, electron mobility increases in conjunction with an increase in the number of electrons being conducted. In addition, the present inventors discovered that if a TFT is fabricated using this film, transistor characteristics, such as on/off ratio, saturation current in a pinch-off state and switching speed, improve even further. That is, the present inventors discovered that, using an amorphous oxide, a normally-off type TFT can be realized.

If an amorphous oxide thin film is used as the film transistor channel layer, electron mobility can be made to exceed 1 $cm^2/(V \cdot sec)$, and preferably exceed 5 $cm^2/(V \cdot sec)$.

When the electron carrier density is less than $1 \times 10^{18}/cm^3$, and preferably less than $1 \times 10^{16}/cm^3$, the current between the drain and source when in an off state (no applied gate voltage) can be made to be less than 10 microamperes, and preferably less than 0.1 microamperes.

In addition, if the above film is used, and when electron mobility exceeds 1 $cm^2/(V \cdot sec)$, and preferably exceeds 5 $cm^2/(V \cdot sec)$, the saturation current after pinching-off can be made to exceed 10 microamperes, and the on/off ratio can be made to exceed $10^3$.

In a TFT, in the pinched-off state, a high voltage is applied to the gate terminal, whereby electrons are present in a high density in the channel.

Accordingly, according to the present invention, the saturation current value can be further increased by just the amount that the electron mobility increases. As a result, an improvement in transistor characteristics, such as greater on/off ratio, higher saturation current and faster switching speed can be expected.

In contrast, in a conventional compound, if the number of electrons increases, electron mobility decreases due to the electrons colliding into each other.

Structures which can be used for the above-described TFT include a staggered (top-gate) structure which forms a gate insulating layer and a gate terminal in that order on a semiconductor channel layer, and a inversely staggered (bottom-gate) structure which forms a gate insulating layer and a semiconductor channel layer in that order on a the gate terminal.

First Deposition Method

PLD

An amorphous oxide having a composition in its crystalline state which can be expressed as $InGaO_3(ZnO)_m$ (m is a natural number of less than 6) can be stably maintained in an amorphous state until a high temperature of 800° C. or higher when the value of m is less than 6, but as the value of m increases, i.e. as the ratio of ZnO to $InGaO_3$ increases, becoming more like a ZnO composition, the oxide crystallizes more easily.

Therefore, as an amorphous TFT channel layer, the value of m is preferably less than 6.

The deposition method preferably uses a vapor deposition method when the target is a polycrystalline sintered body having an $InGaO_3(ZnO)_m$ composition. Among vapor deposition methods, sputtering and pulsed laser deposition are suitable. From a mass-production viewpoint, sputtering is the most suitable.

However, if an amorphous film is fabricated under ordinary conditions, oxygen deficiency occurs to a large extent, whereby until now it was impossible to make the electron carrier density to less than $1 \times 10^{18}/cm^3$ and electrical conductivity to 10 S/cm or less. Further, when such a film was used, it is impossible to construct a normally-off transistor.

Figure 8:
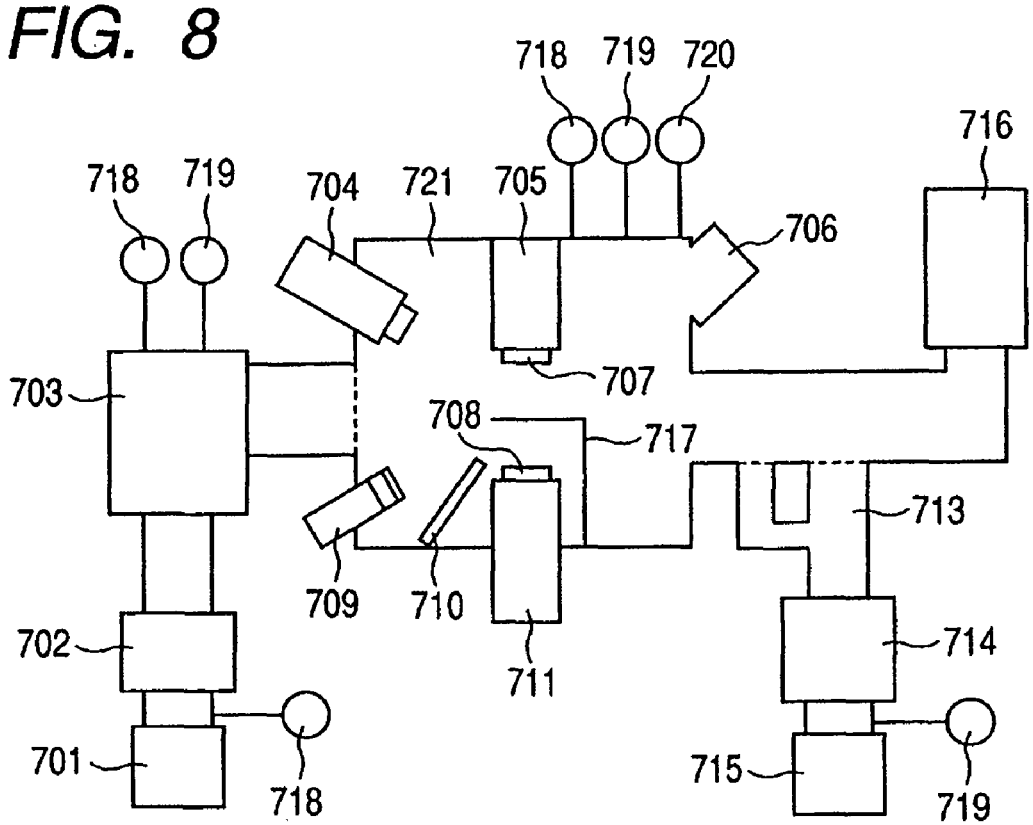
FIG. 8 is a schematic diagram of an apparatus for carrying out deposition by PLD.

The present inventors fabricated In—Ga—Zn—O produced by pulsed laser deposition using the apparatus illustrated in FIG. 8.

Deposition was carried out using a pulsed laser deposition apparatus such as that illustrated in FIG. 8.

In FIG. 8, reference numeral 701 denotes a RP (rotary pump), 702 denotes a TMP (turbo molecular pump), 703 denotes a preparation chamber, 704 denotes a RHEED electron gun, 705 denotes substrate support means for rotating and vertical movement of the substrate, 706 denotes a laser entrance window, 707 denotes a substrate, 708 denotes a target, 709 denotes a radical source, 710 denotes a gas entrance window, 711 denotes target support means for rotating and vertical movement of the target, 712 denotes a bias line, 713 denotes a main line, 714 denotes a TMP (turbo molecular pump), 715 denotes a RP (rotary pump), 716 denotes a titanium getter pump and 717 denotes a shutter. Further, in FIG. 8 reference numeral 718 denotes an IG (ion gauge), 719 denotes a PG (Pirani gauge), 720 denotes a BG (Baratron gauge) and 721 denotes a growth chamber (chamber).

An In—Ga—Zn—O system amorphous oxide semiconductor thin-film was deposited on a $SiO_2$ glass substrate (1737, manufactured by Corning Incorporated) by pulsed laser deposition employing a KrF excimer laser. As a pre-deposition treatment, degreasing cleaning of the substrate by ultrasound was conducted using acetone, ethanol and pure water (each for 5 minutes), and then drying in air at 100° C.

For the above polycrystalline target, an $InGaO_3(ZnO)_4$ sintered body target (size 20 mmϕ 5 mmt) was used. This was obtained by subjecting $In_2O_3$:$Ga_2O_3$:ZnO (each a 4N reagent) as the source material to wet blending (solvent: ethanol), and then calcining (1,000° C. for 2 hours), dry grinding and sintering (1,550° C. for 2 hours). The electrical conductivity of the thus-obtained target was 90 (S/cm).

The degree of vacuum of the growth chamber was set to $2\times10^{-6}$ (Pa), and deposition was carried out by controlling the oxygen partial pressure during growth to 6.5 (Pa).

The oxygen partial pressure in the chamber 721 was 6.5 Pa and the substrate temperature was 25° C.

The distance between the target 708 and the substrate 707 which was to undergo deposition was 30 (mm), and the power of the KrF excimer laser injected from the entrance window 716 was within the range of 1.5 to 3 (mJ/$cm^2$/pulse). Pulse width was 20 (nsec), and repetition frequency was 10 (Hz). Irradiation spot diameter was set at 1×1 (mm angle).

Deposition was conducted in such a manner at a deposition rate of 7 (nm/min).

Small angle X-ray scattering method (SAXS) (thin-film method, incidence angle 0.5 degrees) of the obtained thin-film showed that the fabricated In—Ga—Zn—O system thin film could be called amorphous, in view of the fact that a clear diffraction peak could not be observed.

It was learned from analysis of the pattern obtained from X-ray reflectivity measurement that the root-mean square roughness (Rrms) of the film was approximately 0.5 nm and that film thickness was about 120 nm. Fluorescent X-ray (XRF) analysis showed that the metal composition ratio of the thin-film was In:Ga:Zn=0.98:1.02:4.

Electrical conductivity was less than about $10^{-2}$ S/cm. Electron carrier density could be estimated to be approximately $10^{16}$/$cm^3$ or less, and electron mobility to be 5 $cm^2$/(V·sec).

Analysis of the optical absorption spectrum showed that the optical bandgap energy of the fabricated amorphous thin-film was about 3 eV. From the above results, it was learned that the fabricated In—Ga—Zn—O system thin film existed in an amorphous phase close to a composition of crystalline $InGaO_3(ZnO)_4$, that there was little oxygen deficiency, and that the thin-film was a transparent and flat thin-film which had low electrical conductivity.

This will now be specifically explained with reference to FIG. 1. FIG. 1 illustrates the change in electron carrier density of the deposited oxide if the oxygen partial pressure is varied when a transparent amorphous oxide thin-film constituted from In—Ga—Zn—O, in which the composition is expressed as $InGaO_3(ZnO)_m$ (m is a natural number of less than 6), and which is assumed to have a crystalline state, is fabricated under the same conditions as the present embodiment.

Under the same conditions as those of the present embodiment, electron carrier density was able to be reduced to less than $1\times10^{18}$/$cm^3$ as illustrated in FIG. 1, by carrying out deposition in an atmosphere having a high oxygen partial pressure which exceeded 4.5 Pa. In this case, the temperature of the substrate was intentionally not raised, being maintained at approximately room temperature. When using a flexible plastic film as the substrate, it is preferable to maintain the substrate temperature to below 100° C.

If the oxygen partial pressure is still further increased, it is possible to reduce the electron carrier density still further. For example, as illustrated in FIG. 1, for an $InGaO_3(ZnO)_4$ thin-film deposited at a substrate temperature of 25° C. and an oxygen partial pressure of 5 Pa, it was possible to further reduce electron carrier density to $1\times10^{16}$/$cm^3$.

Figure 2:
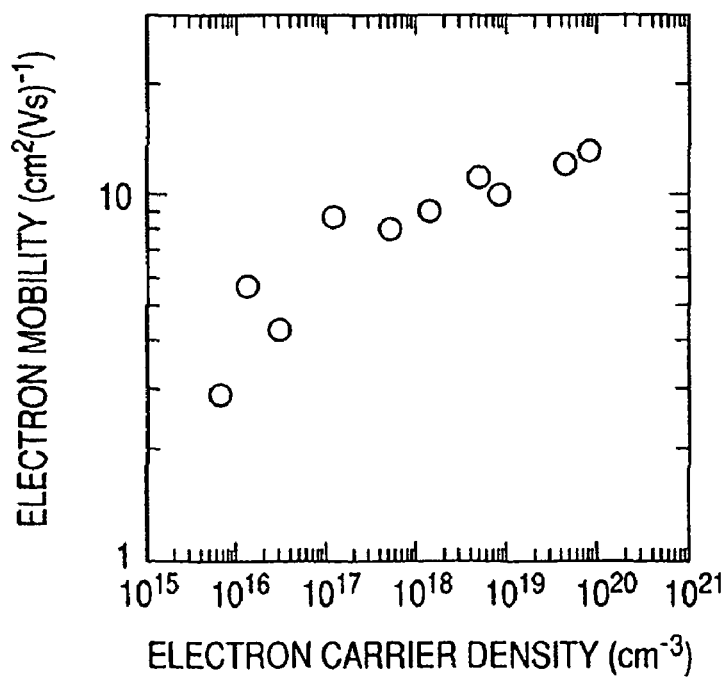
FIG. 2 is a graph illustrating the relationship between the electrical conductivity of an In—Ga—Zn—O system amorphous film deposited by sputtering using argon gas and the oxygen partial pressure during deposition.

As illustrated in FIG. 2, the obtained thin-film had an electron mobility of more than 1 $cm^2$/(V·sec). However, with the pulsed laser deposition method of the present embodiment, if the oxygen partial pressure is set to 6.5 Pa or more the surface of the deposited film is uneven, making it difficult to use as the channel layer of a TFT.

Therefore, if a transparent amorphous oxide thin-film in which the composition in a crystalline state is expressed as $InGaO_3(ZnO)_m$ (m is a natural number of less than 6) is employed in an atmosphere wherein the oxygen partial pressure is more than 4.5 Pa, and preferably more than 5 Pa, but less than 6.5 Pa, it is possible to construct a normally-off transistor.

In addition, the electron mobility of this thin-film was more than 1 $cm^2$/V·sec, and the on/off ratio could be increased to more than $10^3$.

Thus, as explained above, when carrying out deposition of an InGaZn oxide by PLD under the conditions shown in the present embodiment, it is preferable to control the oxygen partial pressure to be from 4.5 Pa or more, but less than 6.5 Pa.

Further, the realization of an electron carrier density of less than $1\times10^{18}$/$cm^3$ is dependent on factors such as the oxygen partial pressure conditions, the structure of the deposition apparatus and the materials and composition which are deposited.

Figure 5:
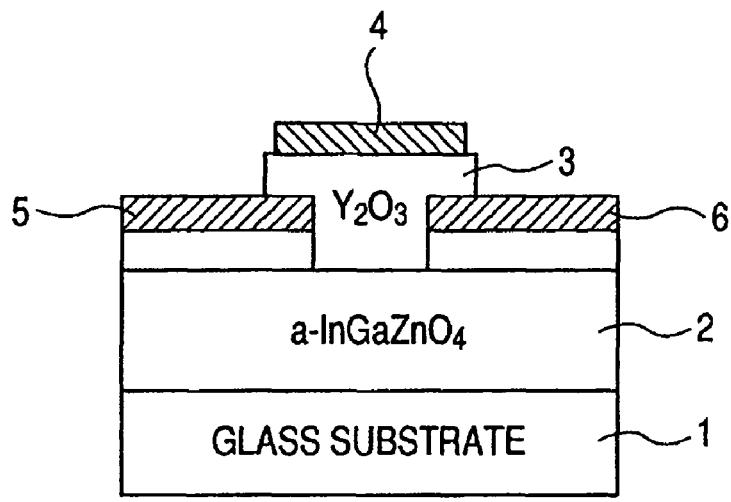
FIG. 5 is a schematic diagram illustrating a top-gate type MISFET device structure.

Next, an amorphous oxide was produced in the above-described apparatus under conditions of an oxygen partial pressure of 6.5 Pa, and the top-gate type MISFET device illustrated in FIG. 5 was fabricated. Specifically, first, a 120 nm thick semi-insulating amorphous $InGaO_3(ZnO)_4$ film to be used as a channel layer 2 was formed on a glass substrate 1 by the above-described amorphous In—Ga—Zn—O thin-film fabricating method.

Next, the oxygen partial pressure in the chamber was set to less than 1 Pa, and high-electrical conductivity $InGaO_3(ZnO)_4$ and gold film were each laminated on top of this layer to a 30 nm thickness by pulsed laser deposition. A drain terminal 5 and source terminal 6 were formed by photolithography and a lift-off technique. Finally, a $Y_2O_3$ film was deposited as a gate insulating film 3 by electron beam deposition (thickness: 90 nm; relative dielectric constant: about 15; leak current density: $10^{-3}$ A/$cm^2$ when applying 0.5 MV/cm). Gold was deposited on top of this film, and a gate terminal 4 was formed by photolithography and a lift-off technique.

MISFET Device Characteristics Evaluation

Figure 6:
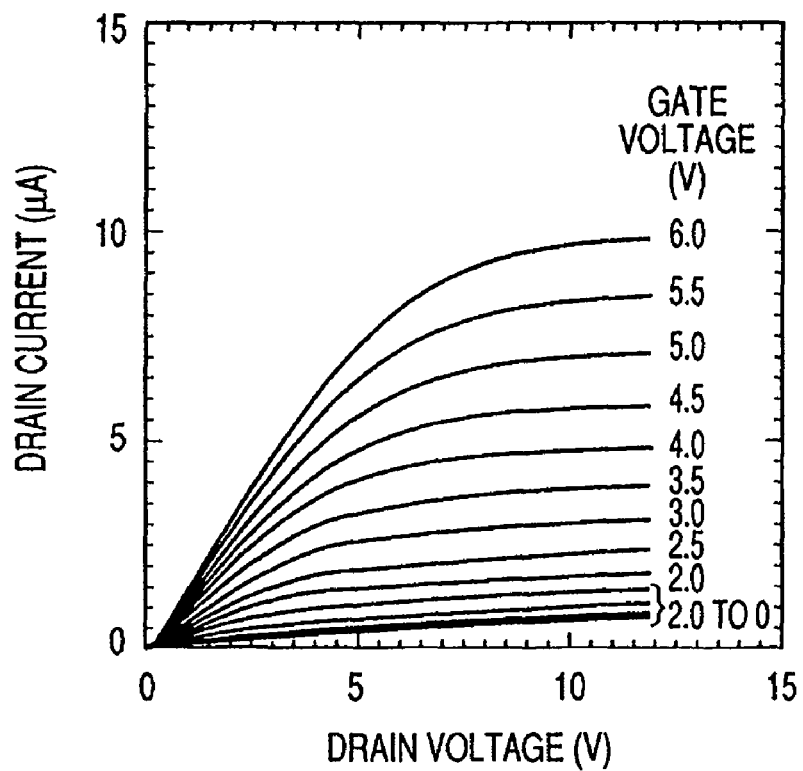
FIG. 6 is a graph illustrating the current-voltage characteristics of a top-gate type MISFET device.

FIG. 6 illustrates the current-voltage characteristics of the MISFET device measured at room temperature. It can be seen that the channel is an n-type semiconductor from the fact that the drain current $I_{DS}$ increases in conjunction with an increase in the drain voltage $V_{DS}$. This does not contradict the fact that an amorphous In—Ga—Zn—O system semiconductor is an n-type. This shows the behavior of a typical transistor wherein the $I_{DS}$ is $V_{DS}$=about 6 V and is saturated (pinched-off). A check of the gain characteristics showed that the threshold of the gate voltage $V_{GS}$ when $V_{DS}$=4 V applied was approximately −0.5 V. Further, when $V_G$=10 V, a current of $I_{DS}$=1.0×10$^{-5}$ A flowed. This matches with the fact that carriers were able to be induced in the In—Ga—Zn—O system amorphous semiconductor thin-film of the insulating body from the gate bias.

The transistor on/off ratio was more than 10$^3$. Calculation of the field effect mobility from the output characteristics showed that a field effect mobility of about 7 cm$^2$ (Vs)$^{-1}$ was obtained in the saturated region. Although the same measurements were performed by irradiating visible light on the fabricated device, no change in the transistor characteristics could be confirmed.

According to the present embodiment, electron carrier density is small, so that a thin-film transistor can be realized having a high electric resistance and a channel layer in which electron mobility is large.

The above-described amorphous oxide comprises the excellent characteristics of electron mobility increasing in conjunction with an increase in electron carrier density, and expression of degenerating conduction.

Although in the present embodiment a thin-film transistor was formed on a glass substrate, since the deposition itself can be conducted at room temperature, a plastic sheet, film or similar substrate can also be used.

The amorphous oxide obtained in the present embodiment showed hardly any optical absorption of visible light, whereby a transparent flexible TFT can be realized.

Second Deposition Method

Sputtering (SP method)

Deposition by a high-frequency SP method employing argon gas as the atmospheric gas will be now explained.

Figure 9:
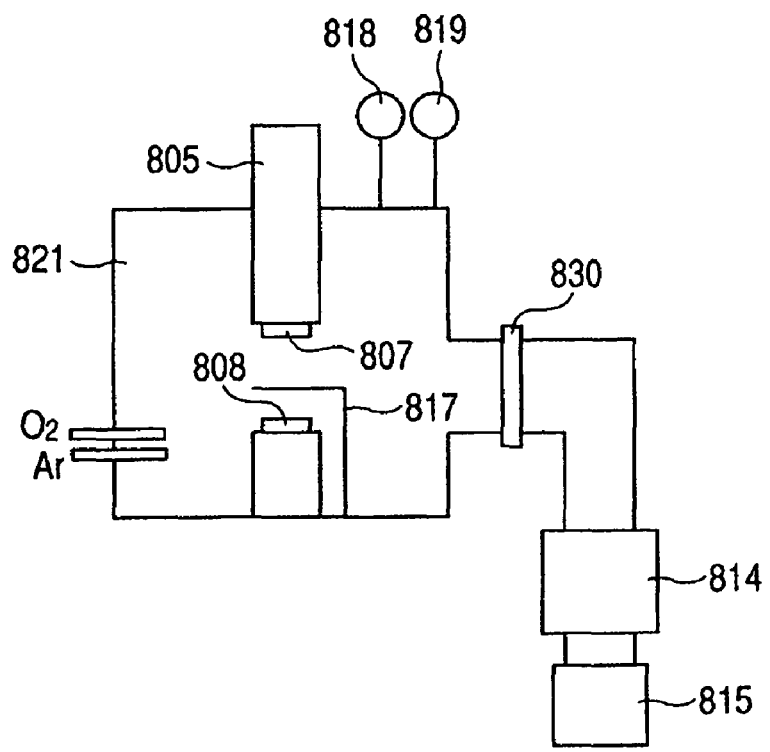
FIG. 9 is a schematic diagram of an apparatus for carrying out deposition by sputtering.

The SP method was carried out using the apparatus illustrated in FIG. 9. In FIG. 9, reference numeral 807 denotes a substrate to undergo deposition, 808 denotes a target, 805 denotes substrate support means equipped with a cooling mechanism, 814 denotes a turbo molecular pump, 815 denotes a rotary pump, 817 denotes a shutter, 818 denotes an ion gauge, 819 denotes a Pirani gauge, 821 denotes a growth chamber (chamber) and 830 denotes a gate valve.

As the substrate 807 to undergo deposition, a SiO$_2$ glass substrate (1737, manufactured by Corning Incorporated) was prepared. As a pre-deposition treatment, degreasing cleaning of the substrate by ultrasound was conducted using acetone, ethanol and pure water (each for 5 minutes), and then drying in air at 100° C.

For the target material, polycrystalline sintered body target (size 20 mmφ 5 mmt) comprising an InGaO$_3$(ZnO)$_4$ was used.

This sintered body was produced by subjecting In$_2$O$_3$:Ga$_2$O$_3$:ZnO (each a 4N reagent) as the source material to wet blending (solvent: ethanol), and then calcining (1,000° C. for 2 hours), dry grinding and sintering (1,550° C. for 2 hours). The electrical conductivity of this target 808 was 90 (S/cm), which was a semiconducting state.

The degree of vacuum of the growth chamber 821 was set to 1×10$^{-4}$ (Pa), and the total pressure of the oxygen gas and argon gas during deposition was set to a fixed value in the range of from 4 to 1×10$^{-1}$ (Pa). The oxygen partial pressure was varied in the range of 10$^{-3}$ to 2×10$^{-1}$ (Pa) by varying the partial pressures of the argon gas and the oxygen.

The substrate temperature was set to room temperature, and the distance between the target 808 and the substrate 807 which was to undergo deposition was 30 (mm).

The injected power was RF 180 W, and the deposition rate was 10 (nm/min).

Small angle X-ray scattering method (SAXS) (thin-film method, incidence angle 0.5 degrees) of the obtained thin-film showed that the fabricated In—Ga—Zn—O system thin film was an amorphous film, in view of the fact that a clear diffraction peak could not be observed.

It was further learned from analysis of the pattern obtained from X-ray reflectivity measurement that the root-mean square roughness (Rrms) of the film was approximately 0.5 nm and that film thickness was about 120 nm. Fluorescent X-ray (XRF) analysis showed that the metal composition ratio of the thin-film was In:Ga:Zn=0.98:1.02:4.

While varying the oxygen partial pressure of the atmosphere during deposition, the electrical conductivity of the obtained amorphous oxide film was measured. The results are shown in FIG. 3.

Figure 3:
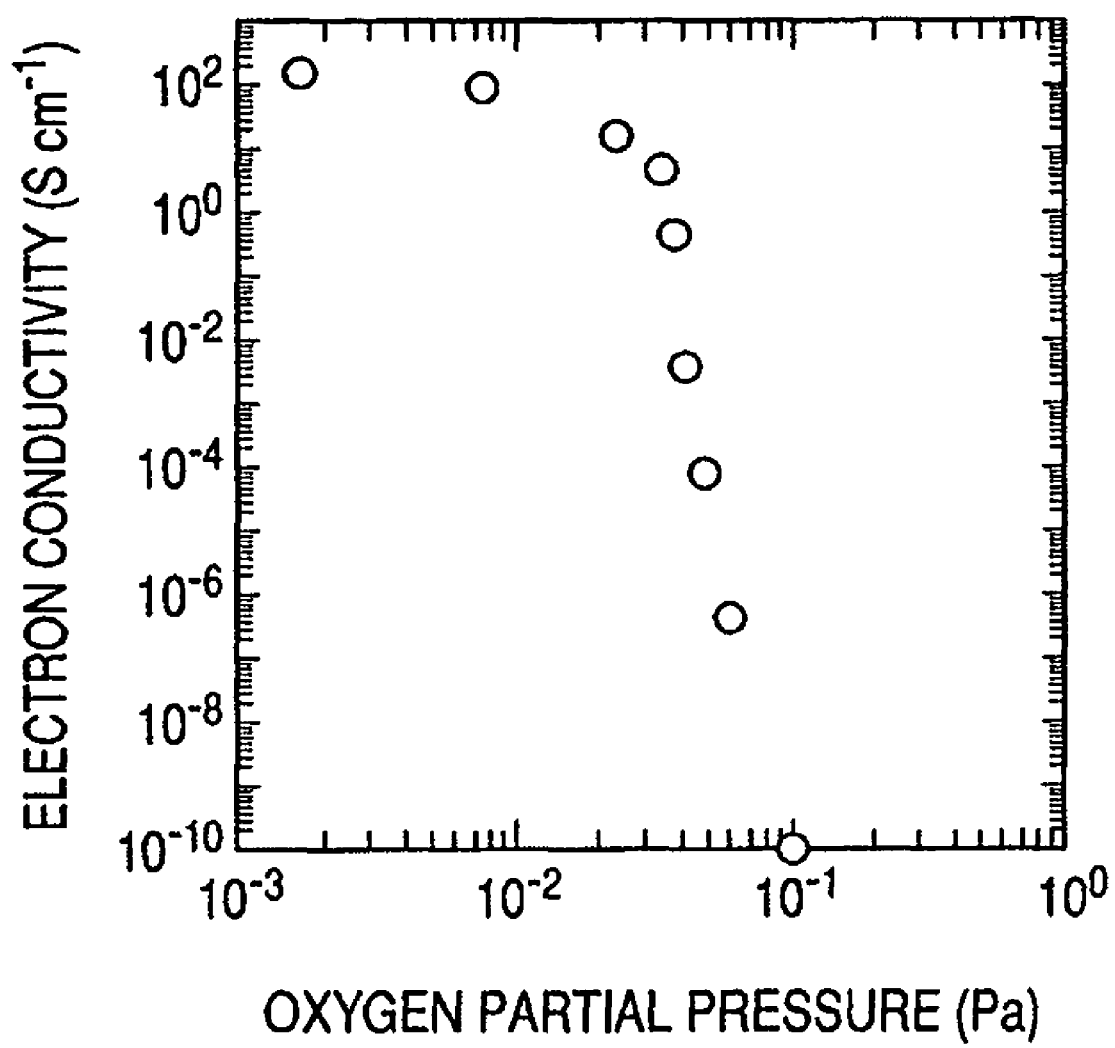
FIG. 3 is a graph illustrating the relationship between the number of electron carriers of an In—Ga—Zn—O system amorphous film deposited by pulsed laser deposition and electron mobility.

As shown in FIG. 3, by carrying out deposition in an atmosphere having a high oxygen partial pressure of more than 3×10$^{-2}$ Pa, the electrical conductivity was able to be reduced to less than 10 S/cm.

By increasing the oxygen partial pressure still further, it is possible to reduce the electron carrier density even more.

For example, as illustrated in FIG. 3, for an InGaO$_3$(ZnO)$_4$ thin-film deposited at a substrate temperature of 25° C. and an oxygen partial pressure of 10$^{-1}$ Pa, it was possible to further reduce electric conductivity to about 10$^{-10}$ S/cm. On the other hand, the electrical conductivity of an InGaO$_3$(ZnO)$_4$ thin-film deposited at an oxygen partial pressure of more than 10$^{-1}$ Pa could not be measured as the electric resistance was too high. In a case such as this, although it was impossible to measure electron mobility, the electron mobility was estimated to be about 1 cm$^2$/V·sec by extrapolating from the value from a film having a large electron carrier density.

That is, using a transparent amorphous oxide thin-film constituted from In—Ga—Zn—O produced using a sputtering deposition method, in which the composition in a crystalline state is expressed as InGaO$_3$(ZnO)$_m$ (m is a natural number of less than 6), a normally-off transistor having an on/off ratio of more than 10$^3$ could be fabricated in an argon gas atmosphere having an oxygen partial pressure exceeding 3×10$^{-2}$ Pa, and preferably exceeding 5×10$^{-1}$ Pa.

When the apparatus and materials illustrated in the present embodiment are used, the oxygen partial pressure during deposition by sputtering is, for example, in the range of 3×10$^{-2}$ Pa or more and 5×10$^{-1}$ Pa or less. As illustrated in FIG. 2, a thin-film fabricated by pulsed laser deposition or sputtering has an electron mobility which increases in conjunction with an increase in the number of electrons being conducted.

As explained above, controlling the oxygen partial pressure allows oxygen deficiency to be reduced, thereby enabling electron carrier density to be reduced. Unlike in a polycrystalline state, since particle interfaces inherently do not exist in an amorphous state, an amorphous thin-film having a high electron mobility can be obtained.

It is noted that even when a 200 μm thick polyethylene terephthalate (PET) film was used in place of a glass substrate, the obtained InGaO$_3$(ZnO)$_4$ amorphous oxide film showed the same characteristics.

If polycrystalline InGaO$_3$(Zn$_{1-x}$Mg$_x$O)$_m$ (m is a natural number of less than 6; 0<x≦1) is used, a high-resistance InGaO$_3$(Zn$_{1-x}$Mg$_x$O)$_m$ amorphous film can be obtained even if the oxygen partial pressure is less than 1 Pa.

For example, when a target is used with 80 atom % of its Zn substituted with Mg, the electron carrier density of a film obtained by pulsed laser deposition can be below made to be 1×10$^{16}$/cm$^3$ (electric resistance value is about 10$^{-2}$ S/cm).

Although the electron mobility of such a film is lower than that of a Mg-free film, the difference is not large, wherein the room temperature electron mobility is about 5 cm$^2$/(V·sec). Compared with amorphous silicon, this is a value larger by about one order. When deposition is conducted under the same conditions, electrical conductivity and electron mobility both decrease in relation to the increase in Mg content. Thus, Mg content is preferably more than 20%, and is less than 85% (taking the content as x, 0.2<x<0.85).

As described above, by controlling oxygen partial pressure, oxygen deficiency can be reduced, whereby electron carrier density can be reduced without adding a specific impurity ion. Further, unlike a polycrystalline state, particle interfaces do not inherently exist in an amorphous state, which allows for an amorphous thin-film having a high electron mobility to be obtained. In addition, since the number of electrons being conducted can be reduced without the addition of a specific impurity ion, there is no scattering due to impurities, whereby electron mobility can be maintained at a high level.

For a thin-film transistor which employs the above-described amorphous oxide, Al$_2$O$_3$, Y$_2$O$_3$, or HfO$_2$, or a mixed compound consisting of at least two thereof, is preferably used as the gate insulating film.

If a defect is present in the interface between the gate insulating thin-film and the channel layer thin-film, a reduction in electron mobility and hysteresis in the transistor characteristics occurs. Further, leak current significantly differs depending on the type of gate insulating film. For these reasons, it is necessary to select a gate insulating thin-film which is suitable for the channel layer. If an Al$_2$O$_3$ film is used, leak current can be lowered. If a Y$_2$O$_3$ film is used, hysteresis can be reduced. If a high dielectric constant HfO$_2$ film is used, electron mobility can be increased. If a mixed crystal of these films is used, a TFT can be formed in which leak current and hysteresis is small, while electron mobility is large. Further, since the gate insulating thin-film forming process and the channel layer forming process can be carried out at room temperature, a TFT structure can be formed in either a staggered structure or an inverse staggered structure.

A TFT formed in this manner is a three-terminal device comprising a gate terminal, a source terminal and a drain terminal, which uses a semiconductor thin-film deposited on an insulating substrate, such as ceramic, glass, plastic or the like, as a channel layer through which electrons or holes move, wherein by applying a voltage to the gate terminal, the current flowing in the channel layer is controlled. A TFT formed in this manner is thus an active device which has the function of switching the current between the source terminal and drain terminal.

It is important in the present invention to control the oxygen deficiency amount in order to achieve a prescribed electron carrier density.

Although in the above-described structure the control of the oxygen amount (oxygen deficiency amount) of the amorphous oxide is achieved by carrying out deposition in an atmosphere comprising a prescribed density of oxygen, other preferable methods include controlling (decreasing or increasing) the oxygen deficiency amount by subjecting the oxide film to a post-treatment in an atmosphere which contains oxygen.

To effectively control the oxygen deficiency amount, the temperature of the oxygen-containing atmosphere is set to 0° C. or more to 300° C. or less, preferably from 25° C. or more to 250° C. or less, and more preferably from 100° C. or more to 200° C. or less.

Obviously, it is acceptable to carry out deposition in an oxygen-containing atmosphere, and then also carry out the post-deposition post-treatment in an atmosphere which contains oxygen. If the prescribed electron carrier density (1×10$^{18}$/cm$^3$) can be attained, it is also acceptable to not control the oxygen partial pressure during deposition, and carry out a post-deposition post-treatment in an atmosphere which contains oxygen.

The lower limit of the electron carrier density in the present invention is, for example, 1×10$^{14}$/cm$^3$, although this depends on what kind of device, circuit or apparatus the obtained oxide film is to be used for.

(Expansion of the Material System)

As a result of progress in research by broadening the material system, it was discovered that an amorphous oxide comprising an oxide of at least one element selected from the group consisting of Zn, In and Sn can be used to fabricate an amorphous oxide film having low electron carrier density and high electron mobility.

It was further discovered that such an amorphous oxide film has the unique characteristic that electron mobility increases in conjunction with an increase in the number of electrons being conducted.

A normally-off type TFT having excellent transistor characteristics, such as on/off ratio, saturation current in a pinched-off state and switching speed, can be fabricated by fabricating a TFT which employs such film.

A complex oxide can be constituted comprising the below elements in the amorphous oxide which comprises at least one element selected from among the above-described Zn, In and Sn.

Such elements include at least one element selected from the group consisting of: group 2 elements M2 (M2 denoting Mg and Ca) which have an atomic number below that of zinc; group 3 elements M3 (M3 denoting B, Al, Ga and Y) which have an atomic number below that of indium; group 4 elements M4 (M4 denoting Si, Ge and Zr) which have an atomic number below that of tin; group 5 elements M5 (M5 denoting V, Nb and Ta); and Lu and W.

In the present invention, an oxide can be employed which has the below characteristics (a) through (h).

(a) An amorphous oxide having an electron carrier density at room temperature of less than 1×10$^{18}$/cm$^3$.

(b) An amorphous oxide wherein electron mobility increases in conjunction with an increase in the number of electrons being conducted.

Here, room temperature refers to a temperature of from about 0° C. to 40° C. The term "amorphous oxide" refers to a compound in which only a halo pattern (no specific diffraction lines shown) can be observed in its X-ray diffraction spectrum. Furthermore, "electron mobility" as used here refers to the electron mobility obtained from Holl effect measurement.

(c) The amorphous oxide described in the above (a) or (b), wherein electron mobility at room temperature exceeds 0.1 cm$^2$/(V·sec).

(d) The amorphous oxide described in the above (b) to (c) which expresses degenerating conduction. Here, the term "degenerating conduction" refers to the condition where thermal activation energy in the temperature dependency of electric resistance is 30 meV or less.

(e) The amorphous oxide described in the above (a) to (d), which comprises at least one element selected from the group consisting of Zn, In and Sn as a structural component.

(f) An amorphous oxide film, wherein the amorphous oxide described in the above (e) comprises at least one element selected from the group consisting of: group 2 elements M2 (M2 denoting Mg and Ca) which have an atomic number below that of zinc; group 3 (group 13) elements M3 (M3 denoting B, Al, Ga and Y) which have an atomic number below that of indium; group 4 elements M4 (M4 denoting Si, Ge and Zr) which have an atomic number below that of tin; group 5 elements M5 (M5 denoting V, Nb and Ta); and Lu and W.

(g) The amorphous oxide film described in any of the above (a) to (f), wherein the composition of its crystalline state is the simple compound $In_{1-x}M3_xO_3(Zn_{1-y}M2_yO)$ ($0 \leq x, y \leq 1$; m is zero or a natural number of less than 6), or a mixture of compounds in which m is different. M3 is, for example, Ga, and M2 is, for example, Mg.

(h) The amorphous oxide film described in any of the above (a) to (g) provided on a glass substrate, a metal substrate, a plastic substrate or a plastic film substrate.

Further, the present invention is a field effect transistor which employs the amorphous oxide or amorphous oxide film described in the above (10) for the channel layer.

Constituted is a field effect transistor which employs an amorphous oxide film having an electron carrier density of less than $1 \times 10^{18}/cm^3$ but more than $1 \times 10^{15}/cm^3$ for the channel layer, and which is provided with a gate terminal via a source terminal, a drain terminal and a gate insulating film. When about 5 V is applied between the source and drain terminals, the current between the source and drain terminals when no gate voltage is applied can be made to be $10^{-7}$ amperes.

The electron mobility of an oxide crystal increases as the overlap of the metal ion s orbitals increases, so that an oxide crystal of Zn, In or Sn, which have a high atomic number, has a large electron mobility of from 0.1 to 200 $cm^2/(V \cdot sec)$.

Further, in oxides the oxygen and the metal ion are ionically bonded.

For that reason, the chemical bond has no orientation, whereby the structure is random. Thus, even for an amorphous state, in which bond orientation is nonuniform, it is possible for electron mobility to be about the same magnitude as the electron mobility of a crystalline state.

On the other hand, by substituting the Zn, In or Sn atom with an element having a lower atomic number, electron mobility is reduced, whereby the electron mobility of the amorphous oxide according to the present invention is about 0.01 $cm^2/(V \cdot sec)$ to 20 $cm^2/(V \cdot sec)$.

When fabricating the channel layer of a transistor using the above-described oxide, it is preferable that $Al_2O_3$, $Y_2O_3$, or $HfO_2$, or a mixed compound consisting of at least two thereof, serves as the gate insulating film.

If a defect is present in the interface between the gate insulating thin-film and the channel layer thin-film, a reduction in electron mobility and hysteresis in the transistor characteristics occurs. Further, leak current significantly differs depending on the type of gate insulating film. For these reasons, it is necessary to select a gate insulating thin-film which is suitable for the channel layer. If an $Al_2O_3$ film is used, leak current can be lowered. If a $Y_2O_3$ film is used, hysteresis can be reduced. If a high dielectric constant $HfO_2$ film is used, field effect mobility can be increased. If a mixed crystal of these films is used, a TFT can be formed in which leak current and hysteresis is small, while field effect mobility is large. Further, since the gate insulating thin-film forming process and the channel layer forming process can be carried out at room temperature, a TFT structure can be formed in either a staggered structure or an inverse staggered structure.

The $In_2O_3$ oxide film can be deposited by a vapor-phase method, wherein an amorphous film can be obtained by charging the atmosphere during deposition with about 0.1 Pa of moisture.

While for ZnO and $SnO_2$ it is difficult to obtain an amorphous film, an amorphous film can be obtained by adding about 20% by atomic weight of $In_2O_3$ in the case of ZnO, and about 90% by atomic weight of $In_2O_3$ in the case of $SnO_2$. In particular, to obtain a Sn—In—O system amorphous film, it is preferable to charge about 0.1 Pa of nitrogen gas into the atmosphere.

The above-described amorphous film can be dosed with an element constituting at least one complex oxide selected from the group consisting of: group 2 elements M2 (M2 denoting Mg and Ca) which have an atomic number below that of zinc; group 3 elements M3 (M3 denoting B, Al, Ga and Y) which have an atomic number below that of indium; group 4 elements M4 (M4 denoting Si, Ge and Zr) which have an atomic number below that of tin; group 5 elements M5 (M5 denoting V, Nb and Ta); and Lu and W.

Dosing with such elements allows for better stabilization of the amorphous film at room temperature, and enables a broader range of compositions which the amorphous film can be obtained.

In particular, dosing with the strongly covalent B, Si or Ge is effective in stabilizing the amorphous phase. Complex oxides which are constituted from ions having a large difference in ionic radius have a stabilized amorphous phase.

For example, in an In—Zn—O system, although it is hard to obtain an amorphous film if indium is not present in excess of about 20 atom % of the composition, a stable amorphous film can be obtained by dosing with magnesium in an amount equivalent to that of the indium, with the indium making up about 15 atom %.

In deposition by a vapor-phase method, an amorphous oxide film can be obtained in which the electron carrier density is less than $1 \times 10^{18}/cm^3$ and more than $1 \times 10^{15}/cm^3$ by controlling the atmosphere.

It is preferable to use a vapor-phase method, such as pulsed laser deposition (PLD), sputtering (SP) and electron beam deposition, as the deposition method for the amorphous oxide. Among vapor-phase methods, PLD is suitable from the viewpoint of easy control of the materials system composition, while sputtering is suitable from a mass-production viewpoint. However, the deposition method is not limited to these methods.

(Deposition of an In—Zn—Ga—O Amorphous Oxide Film by PLD)

An In—Zn—Ga—O system amorphous oxide semiconductor film was deposited by PLD employing a KrF excimer laser onto glass substrates (1737, manufactured by Corning Incorporated) with polycrystalline sintered bodies having an $InGaO_3(ZnO)$ and an $InGaO_3(ZnO)_4$ composition serving as the respective targets.

The apparatus illustrated in FIG. 9 was used as the deposition apparatus. The deposition conditions were the same as when the apparatus was used.

The substrate temperature was 25° C. Small angle X-ray scattering method (SAXS) (thin-film method, incidence angle 0.5 degrees) of the obtained films showed that the In—Zn—Ga—O system films fabricated from the two kinds of target were amorphous films, since clear diffraction peaks could not be observed.

It was learned from analysis of the patterns obtained from X-ray reflectivity measurement that the root-mean square roughness (Rrms) of the In—Ga—Zn—O system amorphous oxide films on the substrate was approximately 0.5 nm and that film thickness was about 120 nm.

Fluorescent X-ray (XRF) analysis showed that the metal composition ratio of the film obtained using a polycrystalline sintered body having an $InGaO_3(ZnO)$ composition as the target was In:Ga:Zn=1.1:1.1:0.9, while the metal composition ratio of the film obtained using a polycrystalline sintered body having an $InGaO_3(ZnO)_4$ composition as the target was In:Ga:Zn=0.98:1.02:4.

Varying the partial pressure of oxygen, the electron carrier density of the amorphous oxide film obtained using a polycrystalline sintered body having an $InGaO_3(ZnO)_4$ composition as the target was measured. The results are shown in FIG. 1. Depositing in an atmosphere having an oxygen partial pressure in excess of 4.2 Pa allowed the electron carrier density to be reduced to less than $1\times10^{18}/cm^3$. In this case, the substrate temperature was maintained at roughly room temperature by intentionally not heating. When the oxygen partial pressure was less than 6.5 Pa, the surface of the obtained amorphous oxide film was flat.

When the oxygen partial pressure was 5 Pa, the obtained using a polycrystalline sintered body having an $InGaO_3(ZnO)_4$ composition as a target was to $10^{16}/cm^3$, and electrical conductivity was to $10^{-2}$ S/cm. Electron mobility was estimated to be about 5 cm$^2$/V·sec. Analysis of the optical absorption spectrum showed that the optical bandgap energy of the fabricated amorphous oxide film was about 3 eV.

Further increasing the oxygen partial pressure enabled the electron carrier density to be further reduced. As shown in FIG. 1, in an In—Zn—Ga—O system amorphous oxide film deposited at substrate temperature of 25° C. and a oxygen partial pressure of 6 Pa, the electron carrier density could be reduced to $8\times10^{15}/cm^3$ (electrical conductivity of about $8\times10^{-3}$ S/cm). Electron mobility was estimated to be about 1 cm$^2$/V·second. However, using PLD, if the oxygen partial pressure is set at 6.5 Pa or more, the surface of the deposited film becomes uneven, whereby it is difficult to use as the TFT channel layer.

The electron carrier density and electron mobility were examined for In—Zn—Ga—O system amorphous oxide films deposited at different oxygen partial pressures using a polycrystalline sintered body having an $InGaO_3(ZnO)_4$ composition as the target. The results are shown in FIG. 2. If the electron carrier density is increased from $1\times10^{16}/cm^3$ to $1\times10^{20}/cm^3$, electron mobility showed an increase from about 3 cm$^2$/V·sec to about 11 cm$^2$/V·sec. In addition, amorphous oxide films obtained using a polycrystalline sintered body having an $InGaO_3(ZnO)$ composition as the target also showed the same trend.

Even when a 200 μm polyethylene terephthalate (PET) film was used in place of the glass substrate, the obtained In—Zn—Ga—O system amorphous oxide film showed the same characteristics.

(Deposition of an In—Zn—Ga—Mg—O Amorphous Oxide Film by PLD)

Using polycrystalline $InGaO_3(Zn_{1-x}Mg_xO)_4$ $(0<x\leq1)$ as a target, an $InGaO_3(Zn_{1-x}Mg_xO)_4$ $(0<x\leq1)$ film was deposited by PLD onto a glass substrate.

The apparatus illustrated in FIG. 8 was used as the deposition apparatus.

A $SiO_2$ glass substrate (1737, manufactured by Corning Incorporated) was prepared as the substrate to undergo deposition. As a pre-deposition treatment on the substrate, degreasing cleaning by ultrasound was conducted using acetone, ethanol and pure water (each for 5 minutes), and then the substrate was dried in air at 100° C. As a target, $InGa(Zn_{1-x}Mg_xO)_4$ (x=1-0) sintered body (size: 20 mmϕ 5 mmt) was used.

The target was fabricated by subjecting $In_2O_3$:$Ga_2O_3$:ZnO:MgO (each a 4N reagent) as the source material to wet blending (solvent: ethanol), and then calcining (1,000° C. for 2 hours), dry grinding and sintering (1,550° C. for 2 hours).

The growth chamber degree of vacuum was set to $2\times10^{-6}$ (Pa), and the oxygen partial pressure during growth was set to 0.8 (Pa). Deposition was carried out at a substrate temperature of 25° C. The distance between the target and the substrate which was to undergo deposition was 30 (mm).

The power of the KrF excimer was 1.5 (mJ/cm$^2$/pulse). Pulse width was 20 (nsec), and repetition frequency was 10 (Hz). Irradiation spot diameter was set at 1×1 (mm angle).

The deposition rate was 7 (nm/min).

The atmosphere had an oxygen partial pressure of 0.8 Pa, and substrate temperature was 25° C. Small angle X-ray scattering method (SAXS) (thin-film method, incidence angle 0.5 degrees) of the obtained film showed that the fabricated In—Zn—Ga—Mg—O system film was an amorphous film, since a clear diffraction peak could not be observed. The surface of the obtained film was flat.

The x value dependency of electrical conductivity, electron carrier density and electron mobility were examined for In—Zn—Ga—Mg—O system amorphous oxide films deposited at an oxygen partial pressure of 0.8 Pa using different x value targets.

Figure 4:
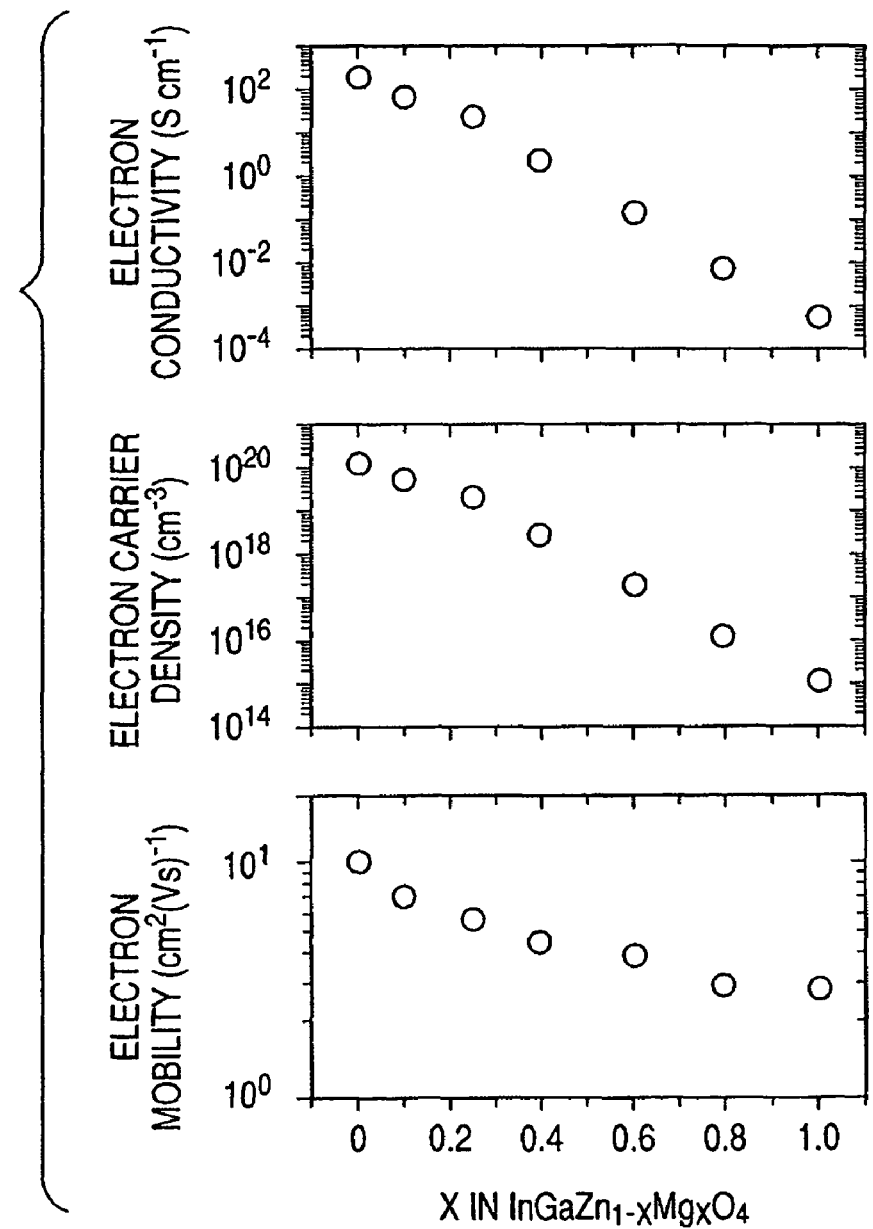
FIG. 4 is a graph illustrating the change in electrical conductivity, carrier density and electron mobility with respect to the x value in $InGaO_3(Zn_{1-x}Mg_xO)$ deposited by pulsed laser deposition in an atmosphere having an oxygen partial pressure of 0.8 Pa.

The results are shown in FIG. 4. It is shown that, when the x value exceeded 0.4, an electron carrier density of less than $1\times10^{18}/cm^3$ was possible at an atmosphere having an oxygen partial pressure of 0.8 Pa. Further, for an amorphous oxide film having an x value of more than 0.4, the electron mobility was more than 1 cm$^2$/V·sec.

As illustrated in FIG. 4, when a target is used in which the Zn is substituted with 80 atom % of Mg, and at an atmosphere having an oxygen partial pressure of 0.8 Pa, the electron carrier density of a film deposited by pulsed laser deposition can be made to be less than $1\times10^{16}/cm^3$ (electrical resistance of about $10^{-2}$ S/cm). Although the electron mobility of such a film is lower than that of a Mg-free film, the difference is not large, wherein the room temperature electron mobility is about 5 cm$^2$/(V·sec). Compared with amorphous silicon, this is a value larger by about one order. When deposition is conducted under the same conditions, electrical conductivity and electron mobility both decrease in relation to the increase in Mg content. Thus, Mg content is preferably more than 20 atom %, and is less than 85 atom % (taking the content as x, $0.2<x<0.85$). Even more preferable is $0.5<x<0.85$.

Even when a 200 μm polyethylene terephthalate (PET) film was used in place of the glass substrate, the obtained $InGaO_3(Zn_{1-x}Mg_xO)_4$ $(0<x\leq1)$ amorphous oxide film showed the same characteristics.

(Deposition of an $In_2O_3$ Amorphous Oxide Film by PLD)

An $In_2O_3$ film was deposited by PLD using a KrF excimer laser onto a 200 μm PET film with an $In_2O_3$ polycrystalline sintered body serving as a target.

The apparatus illustrated in FIG. 8 was used as the apparatus. A SiO$_2$ glass substrate (1737, manufactured by Corning Incorporated) was prepared as the substrate to undergo deposition.

As a substrate pre-deposition treatment, degreasing cleaning by ultrasound was conducted using acetone, ethanol and pure water (each for 5 minutes), and then drying in air at 100° C.

As a target, an In$_2$O$_3$ sintered body (size: 20 mm$\phi$ 5 mmt) was used. The target was prepared by subjecting an In$_2$O$_3$ (4N reagent) source material to calcining (1,000° C. for 2 hours), dry grinding and sintering (1,550° C. for 2 hours).

The growth chamber degree of vacuum was set to $2\times10^{-6}$ (Pa), the oxygen partial pressure during growth was set to 5 (Pa), and the substrate temperature was set to room temperature.

The oxygen partial pressure was set to 5 Pa and the water vapor partial pressure to 0.1 Pa. Oxygen radicals were generated by applying 200 W to an oxygen radical generator.

The distance between the target and the substrate which was to undergo deposition was 40 (nm). The power of the KrF excimer was 0.5 (mJ/cm$^2$/pulse). Pulse width was 20 (nsec), and repetition frequency was 10 (Hz). Irradiation spot diameter was set at 1×1 (mm angle).

The deposition rate was 3 (nm/min).

Small angle X-ray scattering method (SAXS) (thin-film method, incidence angle 0.5 degrees) of the obtained film showed that the fabricated In—O system film was an amorphous film, since a clear diffraction peak could not be observed. Film thickness was 80 nm.

The obtained In—O system amorphous oxide film had an electron carrier density of $5\times10^{17}$/cm$^3$ and an electron mobility of about 7 cm$^2$/(V·sec).

(Deposition of an In—Sn—O System Amorphous Oxide Film by PLD)

An In—Sn—O system oxide film was deposited by PLD using a KrF excimer laser onto a 200 μm PET film with an (In$_{0.9}$Sn$_{0.1}$)O$_{3.1}$ polycrystalline sintered body serving as a target.

Specifically, a SiO$_2$ glass substrate (1737, manufactured by Corning Incorporated) was prepared as the substrate to undergo deposition.

As a substrate pre-deposition treatment, degreasing cleaning by ultrasound was conducted using acetone, ethanol and pure water (each for 5 minutes), and then drying in air at 100° C.

As a target, an In$_2$O$_3$—SnO$_2$ sintered body (size: 20 mm$\phi$ 5 mmt) was prepared. The target was prepared by subjecting an In$_2$O$_3$—SnO$_2$ (4N reagent) source material to material to wet blending (solvent: ethanol), calcining (1,000° C. for 2 hours), dry grinding and sintering (1,550° C. for 2 hours).

The substrate temperature was at room temperature. The oxygen partial pressure wa set to 5 (Pa) and the nitrogen partial pressure was set to 0.1 (Pa). Oxygen radicals were generated by applying 200 W to an oxygen radical generator.

The distance between the target and the substrate which was to undergo deposition was 30 (mm). The power of the KrF excimer was 1.5 (mJ/cm$^2$/pulse). Pulse width was 20 (nsec), and repetition frequency was 10 (Hz). Irradiation spot diameter was set at 1×1 (mm angle).

The deposition rate was 6 (nm/min).

Small angle X-ray scattering method (SAXS) (thin-film method, incidence angle 0.5 degrees) of the obtained film showed that the fabricated In—Sn—O system film was an amorphous film, since a clear diffraction peak could not be observed.

The obtained In—Sn—O system amorphous oxide film had an electron carrier density of $8\times10^{17}$/cm$^3$ and an electron mobility of about 5 cm$^2$/(V·sec). Film thickness was 100 nm.

(Deposition of an In—Ga—O Amorphous Oxide Film by PLD)

A SiO$_2$ glass substrate (1737, manufactured by Corning Incorporated) was prepared as the substrate to undergo deposition.

As a pre-deposition treatment of the substrate, degreasing cleaning by ultrasound was conducted using acetone, ethanol and pure water (each for 5 minutes), and then drying in air at 100° C.

As a target, an (In$_2$O$_3$)$_{1-x}$—(Ga$_2$O$_3$)$_x$ (X=0-1) sintered body (size: 20 mm$\phi$ 5 mmt) was used. When, x=0.1, for example, the target would be an (In$_{0.9}$Ga$_{0.1}$)$_2$O$_3$ polycrystalline sintered body.

The target was prepared by subjecting an In$_2$O$_3$—Ga$_2$O$_2$ (4N reagent) source material to wet blending (solvent: ethanol), calcining (1,000° C. for 2 hours), dry grinding and sintering (1,550° C. for 2 hours). The growth chamber degree of vacuum was set to $2\times10^{-6}$ (Pa), and the oxygen partial pressure during growth to 1 (Pa). Deposition was carried out with a substrate temperature at room temperature. The distance between the target and the substrate which was to undergo deposition was 30 (mm). The power of the KrF excimer was 1.5 (mJ/cm$^2$/pulse). Pulse width was 20 (nsec), and repetition frequency was 10 (Hz). Irradiation spot diameter was set at 1×1 (mm angle). The deposition rate was 6 (nm/min).

Substrate temperature was 25° C. and the oxygen partial pressure was 1 Pa. Small angle X-ray scattering method (SAXS) (thin-film method, incidence angle 0.5 degrees) of the obtained film showed that the fabricated In—Ga—O system film was an amorphous film, since a clear diffraction peak could not be observed. Film thickness was 120 nm.

The obtained In—Ga—O system amorphous oxide film had an electron carrier density of $8\times10^{16}$/cm$^3$ and an electron mobility of about 1 cm$^2$/(V·sec).

(Fabrication of a TFT Device Using an In—Zn—Ga—O System Amorphous Oxide Film (Glass Substrate))

TFT Device Fabrication

The top-gate type TFT device illustrated in FIG. 5 was fabricated.

First, an In—Ga—Zn—O system amorphous oxide film was fabricated onto a glass substrate 1 using the above-described PLD apparatus under an oxygen partial pressure of 5 Pa with a polycrystalline sintered body having an InGaO$_3$(ZnO)$_4$ composition serving as the target. A 120 nm thick In—Ga—Zn—O system amorphous oxide film to be used as a channel layer 2 was formed.

Next, the oxygen partial pressure in the chamber was set to be less than 1 Pa, and high-electrical-conductivity In—Ga—Zn—O system amorphous oxide film and gold film were each laminated on top of this layer to a 30 nm thickness by PLD. A drain terminal 5 and source terminal 6 were formed by photolithography and a lift-off technique.

Finally, a Y$_2$O$_3$ film to be used as a gate insulating film 3 was deposited by electron beam deposition (thickness: 90 nm; relative dielectric constant: about 15; leak current density: $10^{-3}$ A/cm$^2$ when applying 0.5 MV/cm). Gold was deposited on top of this film, and a gate terminal 4 was formed by photolithography and a lift-off technique. Channel length was 50 μm and channel width was 200 μm.

TFT Device Characteristics Evaluation

FIG. 6 illustrates the current-voltage characteristics of a TFT device measured at room temperature. It can be seen that the channel is an n-type conductor from the fact that the drain current $I_{DS}$ increases in conjunction with an increase in the drain voltage $V_{DS}$.

This does not contradict the fact that an amorphous In—Ga—Zn—O system amorphous oxide film is an n-type semiconductor. This shows the behavior of a typical transistor wherein the $I_{DS}$ is $V_{DS}$=about 6 V and is saturated (pinched-off). A check of the gain characteristics showed that the threshold of the gate voltage $V_{GS}$ when $V_{DS}$=4 V applied was approximately −0.5 V.

Further, when $V_G$=10 V, a current of $I_{DS}$=1.0×10⁻⁵ A flowed. This matches with the fact that carriers were able to be induced in the In—Ga—Zn—O system amorphous oxide film of the insulating body from the gate bias.

The transistor on/off ratio was more than 10³. Calculation of the field effect mobility from the output characteristics showed that a field effect mobility of about 7 cm² (Vs)⁻¹ was obtained in the saturated region. Although the same measurements were performed by irradiating visible light on the fabricated device, no change in the transistor characteristics could be confirmed.

Further, setting the electron carrier density of the amorphous oxide to be less than 1×10¹⁸/cm³ allows application as a channel layer. This electron carrier density was preferably 1×10¹⁷/cm³ or less, and was more preferably 1×10¹⁶/cm³ or less.

(Fabrication of a TFT Device Using an In—Zn—Ga—O System Amorphous Oxide Film (Amorphous Substrate))

The top-gate type TFT device illustrated in FIG. 5 was fabricated. First, a 120 nm thick In—Zn—Ga—O system amorphous oxide film to be used as a channel layer 2 was formed onto a polyethylene terephthalate (PET) substrate 1 by PLD under an oxygen partial pressure of 5 Pa with a polycrystalline sintered body having an InGaO₃(ZnO) composition serving as the target.

Next, the oxygen partial pressure in the chamber was set to be less than 1 Pa, and high-electrical-conductivity In—Zn—Ga—O system amorphous oxide film and gold film were each laminated on top of this layer to a 30 nm thickness by PLD. A drain terminal 5 and source terminal 6 were formed by photolithography and a lift-off technique. Finally, a Y₂O₃ film to be used as a gate insulating film 3 was deposited by electron beam deposition. Gold was deposited on top of this film, and a gate terminal 4 was formed by photolithography and a lift-off technique. Channel length was 50 μm and channel width was 200 μm. Three kinds of TFT were fabricated having the above-described structure employing Y₂O₃ (thickness: 140 nm), Al₂O₃ (thickness: 130 μm) and HfO₂ (thickness: 140 μm) as the gate insulating film.

TFT Device Characteristics Evaluation

The current-voltage characteristics of the TFT devices formed on a PET film measured at room temperature were the same as that in FIG. 6. That is, it can be seen that the channels were an n-type conductor from the fact that the drain current $I_{DS}$ increases in conjunction with an increase in the drain voltage $V_{DS}$. This does not contradict the fact that an amorphous In—Ga—Zn—O system amorphous oxide film is an n-type semiconductor. This shows the behavior of a typical transistor wherein the $I_{DS}$ is $V_{DS}$=about 6 V and is saturated (pinched-off). Further, when $V_G$=0, a current of $I_{ds}$=10⁻⁸ A flowed, and when $V_G$=10 V, a current of $I_{DS}$=2.0×10⁻⁵ A flowed. This matches with the fact that carriers were able to be induced in the In—Ga—Zn—O system amorphous oxide film of the insulating body from the gate bias.

The transistor on/off ratio was more than 10³. Calculation of the field effect mobility from the output characteristics showed that a field effect mobility of about 7 cm²(Vs)⁻¹ was obtained in the saturated region.

Although the same measurements for transistor characteristics were performed by bending the devices fabricated on a PET film at a 30 mm radius of curvature, no change in the transistor characteristics could be confirmed. In addition, the same measurements were performed by irradiating visible light on the fabricated devices, although no change in the transistor characteristics could be confirmed.

Even the TFT using an Al₂O₃ film as the gate insulating film showed transistor characteristics similar to those illustrated in FIG. 6, although when $V_G$=0, a current of $I_{ds}$=10⁻⁸ A flowed, and when $V_G$=10 V, a current of $I_{DS}$=5.0×10⁻⁶ A flowed. The transistor on/off ratio was more than 10². Calculation of the field effect mobility from the output characteristics showed that a field effect mobility of about 2 cm²(Vs)⁻¹ was obtained in the saturated region.

Even the TFT using an HfO₂ film as the gate insulating film showed transistor characteristics similar to those illustrated in FIG. 6, although when $V_G$=0, a current of $I_{ds}$=10⁻⁸ A flowed, and when $V_G$=10 V, a current of $I_{DS}$=1.0×10⁻⁶ A flowed. The transistor on/off ratio was more than 10². Calculation of the field effect mobility from the output characteristics showed that a field effect mobility of about 10 cm²(Vs)⁻¹ was obtained in the saturated region.

(Fabrication of a TFT Device Using an In₂O₃ Amorphous Oxide Film by PLD)

The top-gate type TFT device illustrated in FIG. 5 was fabricated. First, an 80 nm thick In₂O₃ amorphous oxide film to be used as a channel layer 2 was formed onto a polyethylene terephthalate (PET) substrate 1 by PLD.

Next, the oxygen partial pressure in the chamber was set to be less than 1 Pa, and the applied voltage to the oxygen radical generator was set to zero. High-electrical-conductivity In₂O₃ amorphous oxide film and gold film were each laminated on top of the above layer to a 30 nm thickness by PLD. A drain terminal 5 and source terminal 6 were formed by photolithography and a lift-off technique. Finally, a Y₂O₃ film to be used as a gate insulating film 3 was deposited by electron beam deposition. Gold was deposited on top of this film, and a gate terminal 4 was formed by photolithography and a lift-off technique.

TFT Device Characteristics Evaluation

The current-voltage characteristics of a TFT device formed on a PET film were measured at room temperature. It can be seen that the channel is an n-type semiconductor from the fact that the drain current $I_{DS}$ increases in conjunction with an increase in the drain voltage $V_{DS}$. This does not contradict the fact that an amorphous In—O system amorphous oxide film is an n-type conductor. This shows the behavior of a typical transistor wherein the $I_{DS}$ is $V_{DS}$=about 5 V and is saturated (pinched-off). Further, when $V_G$=0, a current of $I_{ds}$=2×10⁻⁸ A flowed, and when $V_G$=10 V, a current of $I_{DS}$=2.0×10⁻⁶ A flowed. This matches with the fact that carriers were able to be induced in the In—O system amorphous oxide film of the insulating body from the gate bias.

The transistor on/off ratio was about 10². Calculation of the field effect mobility from the output characteristics showed that a field effect mobility of about 10 cm² (Vs)⁻¹ was obtained in the saturated region. A TFT device fabricated on a glass substrate also showed the same characteristics.

Although the same measurements of transistor characteristics were performed by bending the device fabricated on a PET film at a 30 mm radius of curvature, no change in the transistor characteristics could be confirmed.

(Fabrication of a TFT Device Using an In—Sn—O System Amorphous Oxide Film by PLD)

The top-gate type TFT device illustrated in FIG. 5 was fabricated. First, a 100 nm thick In—Sn—O system amorphous oxide film to be used as a channel layer 2 was formed onto a polyethylene terephthalate (PET) substrate 1 by PLD. Next, the oxygen partial pressure in the chamber was set to be less than 1 Pa, and the applied voltage to the oxygen radical generator was set to zero. High-electrical-conductivity In—Sn—O system amorphous oxide film and gold film were each laminated on top of the above layer to a 30 nm thickness by PLD. A drain terminal 5 and source terminal 6 were formed by photolithography and a lift-off technique. Finally, a $Y_2O_3$ film to be used as a gate insulating film 3 was deposited by electron beam deposition. Gold was deposited on top of this film, and a gate terminal 4 was formed by photolithography and a lift-off technique.

TFT Device Characteristics Evaluation

The current-voltage characteristics of a TFT device formed on a PET film were measured at room temperature. It can be seen that the channel is an n-type semiconductor from the fact that the drain current $I_{DS}$ increases in conjunction with an increase in the drain voltage $V_{DS}$. This does not contradict the fact that In—Sn—O system amorphous oxide film is an n-type conductor. This shows the behavior of a typical transistor wherein the $I_{DS}$ is $V_{DS}$=about 6 V and is saturated (pinched-off). Further, when $V_G$=0, a current of $I_{ds}$=5×10$^{-8}$ A flowed, and when $V_G$=10 V, a current of $I_{DS}$=5.0×10$^{-5}$ A flowed. This matches with the fact that carriers were able to be induced in the In—Sn—O system amorphous oxide film of the insulating body from the gate bias.

The transistor on/off ratio was about 10$^3$. Calculation of the field effect mobility from the output characteristics showed that a field effect mobility of about 5 cm$^2$(Vs)$^{-1}$ was obtained in the saturated region. A TFT device fabricated on a glass substrate also showed the same characteristics.

Although the same measurements of transistor characteristics were performed by bending the device fabricated on a PET film at a 30 mm radius of curvature, no change in the transistor characteristics could be confirmed.

(Fabrication of a TFT Device Using an In—Ga—O System Amorphous Oxide Film by PLD)

The top-gate type TFT device illustrated in FIG. 5 was fabricated. First, a 120 nm thick In—Ga—O system amorphous oxide film to be used as a channel layer 2 was formed onto a polyethylene terephthalate (PET) substrate 1 using the deposition method illustrated in Example 6. Next, the oxygen partial pressure in the chamber was set to be less than 1 Pa, and the applied voltage to the oxygen radical generator was set to zero. High-electrical-conductivity In—Ga—O system amorphous oxide film and gold film were each laminated on top of the above layer to a 30 nm thickness by PLD. A drain terminal 5 and source terminal 6 were formed by photolithography and a lift-off technique. Finally, a $Y_2O_3$ film to be used as a gate insulating film 3 was deposited by electron beam deposition. Gold was deposited on top of this film, and a gate terminal 4 was formed by photolithography and a lift-off technique.

TFT Device Characteristics Evaluation

The current-voltage characteristics of a TFT device formed on a PET film were measured at room temperature. It can be seen that the channel is an n-type semiconductor from the fact that the drain current $I_{DS}$ increases in conjunction with an increase in the drain voltage $V_{DS}$. This does not contradict the fact that In—Ga—O system amorphous oxide film is an n-type conductor. This shows the behavior of a typical transistor wherein the $I_{DS}$ is $V_{DS}$=about 6 V and is saturated (pinched-off). Further, when $V_G$=0, a current of $I_{ds}$=1×10$^{-8}$ A flowed, and when $V_G$=10 V, a current of $I_{DS}$=1.0×10$^{-6}$ A flowed. This matches with the fact that carriers were able to be induced in the In—Ga—O system amorphous oxide film of the insulating body from the gate bias.

The transistor on/off ratio was about 10$^2$. Calculation of the field effect mobility from the output characteristics showed that a field effect mobility of about 0.8 cm$^2$ (Vs)$^{-1}$ was obtained in the saturated region. A TFT device fabricated on a glass substrate also showed the same characteristics.

Although the same measurements of transistor characteristics were performed by bending the device fabricated on a PET film at a 30 mm radius of curvature, no change in the transistor characteristics could be confirmed.

Further, setting the electron carrier density of the amorphous oxide to be less than 1×10$^{18}$/cm$^3$ allows application as a channel layer. This electron carrier density is preferably 1×10$^{17}$/cm$^3$ or less and more preferably 10$^{16}$/cm$^3$ or less.

While explanation will now proceed mainly relating to an In—Ga—Zn—O system oxide compound, the present invention according to the first to third aspects is not limited to the examples illustrated below.

First, examples relating to the first aspect of the present invention (from deposition pre-treatment to post-treatment) will be explained.

EXAMPLE 1-1

First, a PET substrate is placed in the chamber of a UV/O$_3$ surface treatment apparatus, and the substrate surface is irradiated with ultraviolet rays.

The chamber that this apparatus has conducts deposition in an oxygen-containing atmosphere under atmospheric pressure. Ozone forms in the chamber from the ultraviolet ray irradiation. Contaminants on the substrate surface are removed by the ozone and the ultraviolet rays, whereby a clean surface can be obtained.

On a substrate which had undergone surface treatment using this method, an In—Ga—Zn—O system amorphous oxide semiconductor thin-film is deposited by pulsed laser deposition employing a KrF excimer laser with a polycrystalline sintered body having an InGaO$_3$(ZnO)$_4$ composition serving as the target.

The deposition conditions are appropriately set within the above-mentioned range.

Next, the top-gate type MISFET device illustrated in FIG. 5 will be fabricated. Specifically, the device is fabricated in the following manner.

First, a 120 nm thick semi-insulating amorphous InGaO$_3$(ZnO)$_4$ film to be used as a channel layer 2 is formed on a glass substrate 1 by the above-described amorphous In—Ga—Zn—O thin-film fabricating method.

Next, high-electrical-conductivity InGaO$_3$(ZnO)$_4$ and gold film are each laminated on top of this layer to a 30 nm thickness by pulsed laser deposition, and a drain terminal 5 and source terminal 6 are formed by photolithography and a lift-off technique. Finally, a $Y_2O_3$ film to be used as a gate insulating film 3 is deposited by electron beam deposition (thickness: 90 nm; relative dielectric constant: about 15). Gold is deposited on top of this film, and a gate terminal 4 is formed by photolithography and a lift-off technique. From the above steps, a field effect transistor is obtained.

EXAMPLE 1-2

First, a glass substrate (1737, manufactured by Corning Incorporated) is placed in the chamber of a parallel-plate atmospheric-pressure plasma apparatus, and low-energy plasma is irradiated onto the substrate surface.

This apparatus removes contaminants on the substrate surface by irradiating low-energy plasma onto the substrate surface, whereby the state of the substrate top surface can be made to change.

On a substrate which had undergone surface treatment using this method, an In—Ga—Zn—O system amorphous oxide semiconductor thin-film is deposited by pulsed laser deposition employing a KrF excimer laser with a polycrystalline sintered body having an $InGaO_3(ZnO)_4$ composition serving as the target.

It can be confirmed from a peeling test carried out on the obtained amorphous oxide film that the adhesion between the substrate and the amorphous oxide film is extremely good.

An amorphous oxide obtained in this manner can be used to fabricate a transistor such as that illustrated in Example 1, for example.

EXAMPLE 1-3

First, a glass substrate (1737, manufactured by Corning Incorporated) is immersed in an aqueous solution consisting of 5% hydrogen peroxide and 5% ammonia (APM), and subjected to ultrasonic cleaning for 5 minutes.

The substrate is removed from the APM, then immersed in pure water and subjected to ultrasonic cleaning for 5 minutes. After this, the substrate is immersed in an aqueous solution consisting of 5% hydrogen peroxide and 5% hydrogen chloride (HPM), and subjected to ultrasonic cleaning for 5 minutes.

Aqueous hydrogen fluoride or a mixed aqueous solution of hydrogen fluoride and hydrogen peroxide can also be used in place of the HPM. The substrate is removed from the HPM, then immersed in pure water and subjected to ultrasonic cleaning for 5 minutes. The substrate is then dried using dry nitrogen.

Contaminants on the substrate surface are removed by the above cleaning process, whereby a clean surface can be obtained.

Using this method, the above-described In—Ga—Zn—O system amorphous oxide semiconductor thin-film is deposited on a substrate which has undergone surface treatment.

It can be confirmed from a peeling test carried out on the obtained amorphous oxide film that the adhesion between the substrate and the amorphous oxide film is extremely good.

EXAMPLE 1-4

First, a siloxane-based condensate liquid is thinly coated onto a PET substrate by spin coating.

A substrate obtained in this manner is well dried at room temperature and under low humidity conditions.

Alternatively, a PET substrate or PET film product which have undergone a hard-coating treatment may also be used.

An In—Ga—Zn—O system amorphous oxide semiconductor thin-film, for example, is deposited on a substrate which has undergone surface treatment using the above-described method. A transistor can be formed by employing the thin-film obtained in this manner.

EXAMPLE 1-5

An In—Ga—Zn—O system amorphous oxide semiconductor thin-film is deposited on a glass substrate (1737, manufactured by Corning Incorporated) by pulsed laser deposition employing a KrF excimer laser with a polycrystalline sintered body having an $InGaO_3(ZnO)_4$ composition serving as the target.

An ozone generating device is installed in the chamber, wherein deposition is conducted while introducing an ozone-containing oxygen gas in place of the conventional $O_2$ gas.

The oxygen partial pressure in the chamber containing ozone can be set, for example, to 6 Pa and the substrate temperature, for example, to 25° C. The thin-film obtained in this manner is used to fabricate a FET.

Specifically, the top-gate type MISFET device illustrated in FIG. 5 will be fabricated.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method.

Next, the oxygen partial pressure in the chamber is set to be less than 1 Pa, and high-electrical-conductivity $InGaO_3(ZnO)_4$ and gold film are each laminated on top of this layer to a 30 nm thickness by pulsed laser deposition. A drain terminal 5 and source terminal 6 are formed by photolithography and a lift-off technique.

Finally, a $Y_2O_3$ film to be used as a gate insulating film 3 is deposited by electron beam deposition (thickness: 90 nm; relative dielectric constant: about 15; leak current density: $10^{-3}$ A/cm² when applying 0.5 MV/cm).

An ozone generating device is also installed in the electron beam deposition apparatus, wherein deposition is conducted while feeding ozone and $O_2$ gas.

Gold is deposited on top of this film, and a gate terminal 4 is formed by photolithography and a lift-off technique.

Thus, insulating properties can be improved by employing ozone also during gate insulating film formation.

EXAMPLE 1-6

An In—Ga—Zn—O system amorphous oxide semiconductor thin-film is deposited on a glass substrate (1737, manufactured by Corning Incorporated) by pulsed laser deposition employing a KrF excimer laser with a polycrystalline sintered body having an $InGaO_3(ZnO)_4$ composition serving as the target.

In addition to a conventional $O_2$ gas line, a $N_2O$ gas line is installed in the chamber, wherein deposition is conducted while feeding $O_2$ gas and $N_2O$ gas into the chamber in equal flow amounts.

In place of the $N_2O$, $NO_2$ or NO may also be used.

The $O_2+N_2O$ pressure in the chamber is set to about 6 Pa and the substrate temperature to 25° C.

Using this apparatus, the top-gate type MISFET device illustrated in FIG. 5 will be fabricated by depositing an amorphous oxide onto a substrate.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method. Next, the oxygen partial pressure in the chamber is set to be less than 1 Pa, and high-electrical-conductivity $InGaO_3(ZnO)_4$ and gold film are each laminated on top of the formed layer to a 30 nm thickness by pulsed laser deposition. A drain terminal 5 and source terminal 6 are formed by photolithography and a lift-off technique.

Finally, a $Y_2O_3$ film to be used as a gate insulating film 3 is deposited by electron beam deposition (thickness: 90 nm; relative dielectric constant: about 15; leak current density: $10^{-3}$ $A/cm^2$ when applying 0.5 MV/cm).

A $N_2O$ line is also installed in the electron beam deposition apparatus, wherein deposition is conducted while feeding $N_2O$ and $O_2$ gas. Gold is deposited on top of this film, and a gate terminal 4 is formed by photolithography and a lift-off technique.

Thus, insulating properties can be improved by employing ozone also during gate insulating film formation.

EXAMPLE 1-7

An In—Ga—Zn—O system amorphous oxide semiconductor thin-film is deposited by pulsed laser deposition employing a KrF excimer laser onto a glass substrate (1737, manufactured by Corning Incorporated) with a polycrystalline sintered body having an $InGaO_3(ZnO)_4$ composition serving as the target.

A radical generator is installed in the chamber, whereby oxygen radicals are fed onto the substrate by passing $O_2$ gas through the radical generator.

The oxygen partial pressure in the chamber is set to 6 Pa and the substrate temperature to 25° C.

A FET will be fabricated using the above-described thin-film. The top-gate type MISFET device illustrated in FIG. 5 will be fabricated.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method.

Next, the oxygen partial pressure in the chamber is set to be less than 1 Pa, and high-electrical-conductivity $InGaO_3(ZnO)_4$ and gold film are each laminated on top of this layer to a 30 nm thickness by pulsed laser deposition. A drain terminal 5 and source terminal 6 are formed by photolithography and a lift-off technique.

Finally, a $Y_2O_3$ film to be used as a gate insulating film 3 is deposited by electron beam deposition (thickness: 90 nm; relative dielectric constant: about 15; leak current density: $10^{-3}$ $A/cm^2$ when applying 0.5 MV/cm). A radical generator is similarly installed in the electron beam deposition apparatus as well, whereby deposition is carried out while feeding oxygen radicals. Gold is deposited on top of the resulting film, and a gate terminal 4 is formed by photolithography and a lift-off technique.

An FET having extremely good insulating properties for the gate insulating film is thereby realized.

EXAMPLE 1-8

An In—Ga—Zn—O system amorphous oxide semiconductor thin-film is deposited by pulsed laser deposition employing a KrF excimer laser onto a glass substrate (1737, manufactured by Corning Incorporated) with a polycrystalline sintered body having an $InGaO_3(ZnO)_4$ composition serving as the target.

An ECR plasma generator is installed in the chamber, whereby oxygen plasma is fed onto the substrate by passing $O_2$ gas through the ECR plasma generator.

As the plasma generator, an RF plasma generator or a DC plasma generator is acceptable. The oxygen partial pressure in the chamber is set to 6 Pa and the substrate temperature to 25° C.

Using the thin-film obtained in this manner, the top-gate type MISFET device illustrated in FIG. 5 will be fabricated.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method.

Next, the oxygen partial pressure in the chamber is set to be less than 1 Pa, and high-electrical-conductivity $InGaO_3(ZnO)_4$ and gold film are each laminated on top of this layer to a 30 nm thickness by pulsed laser deposition. A drain terminal 5 and source terminal 6 are formed by photolithography and a lift-off technique.

Finally, a $Y_2O_3$ film to be used as a gate insulating film 3 is deposited by electron beam deposition (thickness: 90 nm; relative dielectric constant: about 15; leak current density: $10^{-3}$ $A/cm^2$ when applying 0.5 MV/cm). An ECR plasma generator is similarly installed in the electron beam deposition apparatus as well, whereby deposition is carried out while feeding oxygen plasma. Gold is deposited on top of the resulting film, and a gate terminal 4 is formed by photolithography and a lift-off technique.

An FET having extremely good insulating properties for the gate insulating film is thereby realized.

EXAMPLE 1-9

An In—Ga—Zn—O system amorphous oxide semiconductor thin-film is deposited by pulsed laser deposition employing a KrF excimer laser onto a glass substrate (1737, manufactured by Corning Incorporated) with a polycrystalline sintered body having an $InGaO_3(ZnO)_4$ composition serving as the target.

The oxygen partial pressure in the chamber is set to 6 Pa and the substrate temperature to 25° C.

A substrate which has undergone thin-film deposition is subjected to thermal processing for 2 hours in air at 150° C. using an electric furnace.

Using the thin-film obtained in this manner, the top-gate type MISFET device illustrated in FIG. 5 will be fabricated.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method.

Next, the oxygen partial pressure in the chamber is set to be less than 1 Pa, and high-electrical-conductivity $InGaO_3(ZnO)_4$ and gold film are each laminated on top of this layer to a 30 nm thickness by pulsed laser deposition. A drain terminal 5 and source terminal 6 are formed by photolithography and a lift-off technique.

Finally, a $Y_2O_3$ film to be used as a gate insulating film 3 is deposited by electron beam deposition (thickness: 90 nm; relative dielectric constant: about 15; leak current density: $10^{-3}$ $A/cm^2$ when applying 0.5 MV/cm). After $Y_2O_3$ film deposition as well, thermal processing is performed for 2 hours in air at 150° C. using an electric furnace. Gold is deposited on top of this film, and a gate terminal 4 is formed by photolithography and a lift-off technique.

An FET having extremely good insulating properties for the gate insulating film is thereby realized.

In the present Example 1-9, the thermal processing after amorphous oxide film deposition and after $Y_2O_3$ film deposition can also be carried out in an ozone atmosphere by installing an ozone generator in the electric furnace.

Further, in the present Example 1-9, the thermal processing after amorphous oxide film deposition and after $Y_2O_3$ film deposition can also be carried out in a $N_2O+O_2$ atmosphere by providing a $N_2O$ gas line and an oxygen gas line in the electric furnace.

Further, in the present Example 1-9, the thermal processing after amorphous oxide film deposition and after $Y_2O_3$ film deposition can also be carried out in air having an almost saturated water vapor pressure in a water-vapor oxidation electric furnace.

Further, in the present Example 1-9, the thermal processing after amorphous oxide film deposition and after $Y_2O_3$ film deposition can also be carried out by generating oxygen radicals from a radical generating device provided in the deposition chamber, and heating the substrate to 200° C. with a substrate heater while feeding generated oxygen radicals.

Further, in the present Example 1-9, the thermal processing after amorphous oxide film deposition and after $Y_2O_3$ film deposition can also be carried out using oxygen plasma generated by an ECR plasma generator provided in the deposition chamber. As the oxygen plasma generator, either a RF plasma generator or a DC plasma generator is acceptable. The plasma generator is held, for example, for 2 hours while irradiating the oxygen plasma onto the substrate.

During plasma irradiation onto the oxygen substrate, deposition may be carried out while heating the substrate to 200° C. with a substrate heater.

EXAMPLE 1-10

An In—Ga—Zn—O system amorphous oxide semiconductor thin-film is deposited by pulsed laser deposition employing a KrF excimer laser onto a glass substrate (1737, manufactured by Corning Incorporated) with a polycrystalline sintered body having an $InGaO_3(ZnO)_4$ composition serving as the target. The oxygen partial pressure in the chamber is set to 6 Pa and the substrate temperature to 25° C. Using the thin-film obtained in this manner, the top-gate type MISFET device illustrated in FIG. 5 will be fabricated.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method.

Next, a metal mask provided with apertures in the shape of the drain terminal 5 and the source terminal 6 is mounted so as to closely adhere to the $InGaO_3(ZnO)_4$ film surface which has been deposited. The resulting structure is placed in a chamber, and the oxygen partial pressure in the chamber is set to be less than 1 Pa. High-electrical-conductivity $InGaO_3(ZnO)_4$ and gold film are each laminated to a 30 nm thickness by pulsed laser deposition. A drain terminal 5 and source terminal 6 are then formed by removing the metal mask. Finally, a $Y_2O_3$ film to be used as a gate insulating film 3 is deposited by electron beam deposition (thickness: 90 nm; relative dielectric constant: about 15; leak current density: $10^{-3}$ A/cm² when applying 0.5 MV/cm) in such a way as to be deposited between the drain terminal 5 and source terminal 6, i.e. on the channel. Gold is deposited on top of this film. The metal mask is then removed, to thereby form a gate terminal 4. By using a metal mask, a TFT device can be formed without going through a lithography process.

EXAMPLE 1-11

An In—Ga—Zn—O system amorphous oxide semiconductor thin-film is deposited by pulsed laser deposition employing a KrF excimer laser onto a glass substrate (1737, manufactured by Corning Incorporated) with a polycrystalline sintered body having an $InGaO_3(ZnO)_4$ composition serving as the target.

The oxygen partial pressure in the chamber is set to 6 Pa and the substrate temperature to 25° C.

Using the thin-film obtained in this manner, the top-gate type MISFET device illustrated in FIG. 5 will be fabricated.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method.

The oxygen partial pressure in the chamber is set to be less than 1 Pa, and a gold film is laminated to a 30 nm thickness by pulsed laser deposition. A drain terminal 5 and source terminal 6 are formed by photolithography and wet etching using aqueous $KI+I_2$.

Finally, a $Y_2O_3$ film to be used as a gate insulating film 3 is deposited by electron beam deposition (thickness: 90 nm; relative dielectric constant: about 15; leak current density: $10^{-3}$ A/cm² when applying 0.5 MV/cm). Gold is deposited on top of this film, and a gate terminal 4 is formed by photolithography and plasma dry etching using $CF_4+Ar$ gas.

In this manner, a TFT having little variation between TFT devices formed on the substrate can be fabricated.

Next, examples relating to the second aspect of the present invention (deposition method) will be explained.

EXAMPLE 2-1

An In—Ga—Zn mixture or alloy is placed in a deposition apparatus which uses a tungsten boat as a resistance heating evaporation source.

An In—Ga—Zn—O system amorphous oxide semiconductor thin-film is deposited on a glass substrate (1737, manufactured by Corning Incorporated) which is arranged facing a heating evaporation source, by heating an In—Ga—Zn mixture or alloy in an oxygen atmosphere to cause evaporation. The oxygen partial pressure in the chamber is set to about 0.1 Pa and the substrate temperature to 25° C.

The composition of the In—Ga—Zn mixture or alloy placed in the tungsten boat is adjusted so that the composition of the film deposited on the glass substrate by deposition is formed into a desired composition.

As well as a boat, a filament or basket may also be used as the resistance heating evaporation source, and the material for such object may be molybdenum, tantalum or similar substance.

In this manner, a thin-film of an amorphous oxide is formed on the substrate.

A transistor such as that illustrated in FIG. 5 will be fabricated using this film.

EXAMPLE 2-2

Deposition is carried out using a molecular beam epitaxy (MBE) system having three Knudsen cells and a gas inlet port.

Each of the Knudsen cells is provided with indium, gallium and zinc simple metal, and the Knudsen cell heaters are heated.

The indium, gallium and zinc are thereby made to evaporate. Oxygen gas is simultaneously fed from the gas inlet port, whereby an In—Ga—Zn—O system amorphous oxide semiconductor thin-film is deposited on a glass substrate (1737, manufactured by Corning Incorporated) arranged in the direction in which the Knudsen cells and the gas inlet port are facing.

The chamber internal pressure is set to 0.005 Pa and the substrate temperature to 25° C.

The heating temperature for the Knudsen cells is adjusted so that the composition of the film deposited on the glass substrate is formed into a desired composition.

The oxygen gas fed from the gas inlet port may be ordinary $O_2$ molecular gas, although ozone gas can also be used.

In addition, oxygen radicals may also be fed.

Using the thin-film obtained by the above-described method, the top-gate type MISFET device illustrated in FIG. 5 will be fabricated.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method.

Next, while maintaining the chamber internal pressure to 0.005 Pa, the amount of oxygen gas being fed is reduced to one-half of that during the thin-film fabrication described above. High-electrical-conductivity $InGaO_3(ZnO)_4$ is formed on top of this layer to a 30 nm thickness by the above-described thin-film fabrication method. Gold film is formed on top of this to a 30 nm thickness by resistance heating evaporation using a tungsten boat, and a drain terminal 5 and source terminal 6 are formed by photolithography and a lift-off technique.

Finally, a $Y_2O_3$ film to be used as a gate insulating film 3 is deposited by electron beam deposition (thickness: 90 nm; relative dielectric constant: about 15; leak current density: $10^{-3}$ A/cm$^2$ when applying 0.5 MV/cm). Gold is deposited on top of this film, and a gate terminal 4 is formed by photolithography and a lift-off technique.

In this manner, the FET illustrated in FIG. 5 can be obtained.

EXAMPLE 2-3

An In—Ga—Zn—O system amorphous oxide semiconductor thin-film is deposited on a glass substrate (1737, manufactured by Corning Incorporated) by electron beam deposition while feeding oxygen gas so as to radiate towards the substrate, wherein an $In_2O_3$—$Ga_2O_3$—ZnO oxide sintered body serves as a target.

The chamber internal pressure is set to 0.01 Pa and the substrate temperature to 25° C.

The composition of the $In_2O_3$—$Ga_2O_3$—ZnO oxide sintered body is adjusted so that the composition of the film deposited on the glass substrate is formed into a desired composition.

Using a thin-film of the amorphous oxide obtained in this manner, an FET can be fabricated by the method illustrated in Example 2-2.

EXAMPLE 2-4

An In—Ga—Zn—O system amorphous oxide semiconductor thin-film is deposited on a substrate (1737, manufactured by Corning Incorporated) by chemical vapor deposition (CVD), wherein trimethylgallium (TMG), trimethylindium (TMI), dimethylzinc (DMZ) and oxygen serve as a source gas.

The chamber internal pressure is set to 1 Pa and the substrate temperature to 200° C.

The source gas flow rate is adjusted so that the composition of the film deposited on the glass substrate is formed into a desired composition.

Triethylgallium (TEG), triisobutylgallium (TIBG) or gallium alkoxide can be used in place of TMG.

Further, triethylindium (TEI) or indium alkoxide can be used in place of TMI, and triethylzinc (TEZ) or zinc alkoxide can be used in place of DMZ.

The oxygen gas may be ordinary $O_2$ molecular gas, although ozone gas can also be used. In addition, the oxygen may also be fed into the chamber as oxygen radicals.

In addition, an oxidizing gas such as $NO_2$ or $N_2O$ may also be used.

Using a thin-film of the amorphous oxide obtained in this manner, a FET can be fabricated by the method illustrated in Example 2-2.

EXAMPLE 2-5

In Example 2-4, generating a plasma in the chamber during formation of the amorphous In—Ga—Zn—O thin-film by CVD enables a film having little residual organic matter to be formed at a lower substrate heating temperature.

Specifically, an In—Ga—Zn—O system amorphous oxide semiconductor thin-film is deposited at a chamber internal pressure of 0.1 Pa and a substrate temperature of 100° C. using the same source gas as that in Example 2-4, by using an ECR plasma generator to feed plasma into the chamber.

EXAMPLE 2-6

In Example 2-4, during formation of the amorphous In—Ga—Zn—O thin-film by CVD, immediately after the source gas is fed into the chamber, but before the source gas reaches the substrate, source gas is passed through a tungsten mesh heated to 1,000° C. or more, and then made to arrive at the substrate. According to this method, it is possible to form a film having little residual organic matter at a lower substrate heating temperature, since the source gas is decomposed to a greater extent by the tungsten catalyst.

Platinum, molybdenum, tantalum and the like can also be used in place of the tungsten mesh.

As an example, a tungsten mesh heated to 1,500° C. is introduced into the chamber, whereby an In—Ga—Zn—O system amorphous oxide semiconductor thin-film is deposited at a chamber internal pressure of 1 Pa and a substrate temperature of 100° C. using the same source gas as that in Example 2-4.

EXAMPLE 2-7

Deposition is carried out by line-beam pulsed laser deposition using a 100 mm width laser line beam generated by adding a line optical system to a KrF excimer laser.

A polycrystalline sintered body having a size 100 mm wide and which has an $InGaO_3(ZnO)_4$ composition is used as the target.

An amorphous oxide semiconductor thin-film is deposited onto a 100 mm×100 mm glass substrate while moving the substrate in a vertical direction with respect to the beam line so that the film to be grown is uniformly deposited within the substrate surface.

The oxygen partial pressure in the chamber is set to 6 Pa and the substrate temperature to 25° C.

Using the amorphous oxide thin-film obtained in this manner, the top-gate MISFET device illustrated in FIG. 5 will be fabricated.

First, a 120 nm thick semi-insulating amorphous $InGaO_3(ZnO)_4$ film to be used as a channel layer 2 is formed on a glass substrate 1 by the above-described amorphous In—Ga—Zn—O thin-film fabricating method.

Next, the oxygen partial pressure in the chamber is set to less than 1 Pa, and high-electrical-conductivity InGaO$_3$(ZnO)$_4$ and gold film are each laminated on top of this layer to a 30 nm thickness by line-beam pulsed laser deposition. A drain terminal 5 and source terminal 6 are formed by photolithography and a lift-off technique.

Finally, a Y$_2$O$_3$ film to be used as a gate insulating film 3 is deposited by line-beam pulsed laser deposition (thickness: 90 nm; relative dielectric constant: about 15; leak current density: $10^{-3}$ A/cm$^2$ when applying 0.5 MV/cm). Gold is deposited on top of this film, and a gate terminal 4 is formed by photolithography and a lift-off technique. In this manner, the FET illustrated in FIG. 5 is formed.

EXAMPLE 2-8

Deposition of an amorphous oxide carried out by an electrodeposition method will now be explained.

An In—Ga—Zn—O system amorphous oxide semiconductor thin-film is deposited on a substrate (1737, manufactured by Corning Incorporated) with an aqueous solution containing indium nitrate, gallium nitrate, zinc nitrate and dimethylamineborane (DMAB) serving as the raw material.

First, after undergoing non-electric field deposition, electrodeposition is carried out by using an external power source to apply an electric field on an aqueous solution that does not contain dimethylamineborane (DMAB).

The temperature of the aqueous solution is set from 60° C. (during no electric field) to 85° C. (during electrodeposition).

The aqueous solution serving as the raw material is adjusted so that the composition of the film deposited on the glass substrate is formed into a desired composition.

Using the method illustrated in Example 2-4, a FET is realized which uses the thin-film of an amorphous oxide produced by electrodeposition.

Next, examples relating to the third aspect of the present invention (deposition temperature) will be explained.

EXAMPLE 3-1

An In—Ga—Zn—O system amorphous oxide semiconductor thin-film is deposited on a glass substrate (1737, manufactured by Corning Incorporated) by pulsed laser deposition employing a KrF excimer laser with a polycrystalline sintered body having an InGaO$_3$(ZnO)$_4$ composition serving as the target.

The partial oxygen pressure in the chamber is set to 6 Pa and the substrate temperature to 70° C.

Using a thin film of the amorphous oxide obtained in this manner, the top-gate MISFET device illustrated in FIG. 5 is fabricated.

First, a 120 nm thick semi-insulating amorphous InGaO$_3$(ZnO)$_4$ film to be used as a channel layer 2 is formed on a glass substrate 1 by the above-described amorphous In—Ga—Zn—O thin-film fabricating method.

Next, the oxygen partial pressure in the chamber is set to less than 1 Pa, and high-electrical-conductivity InGaO$_3$(ZnO)$_4$ and gold film are each laminated on top of this layer to a 30 nm thickness by pulsed laser deposition. A drain terminal 5 and source terminal 6 are formed by photolithography and a lift-off technique.

Finally, a Y$_2$O$_3$ film to be used as a gate insulating film 3 is deposited by electron beam deposition (thickness: 90 nm; relative dielectric constant: about 15; leak current density: $10^{-3}$ A/cm$^2$ when applying 0.5 MV/cm). Gold is deposited on top of this film, and a gate terminal 4 is formed by photolithography and a lift-off technique.

The FET illustrated in FIG. 5 is thus obtained.

In addition, the substrate temperature during deposition of the In—Ga—Zn—O system amorphous oxide semiconductor thin-film can be set to, for example, 120° C.

EXAMPLE 3-2

Transparent polycarbonate (PC) is used as the substrate.

Although a 0.3 mm thick substrate is used here, a resin film of about 10 μm to 100 μm can be used. Further, a resin substrate or resin film coated on its surface with a silicon oxide film, silicon nitride film or the like may also be used.

An In—Ga—Zn—O system amorphous oxide semiconductor thin-film is fabricated by sputtering deposition in an argon gas atmosphere having an oxygen partial pressure exceeding $3 \times 10^{-1}$ Pa, and preferably exceeding $5 \times 10^{-1}$ Pa. The substrate temperature during deposition is set to 120° C. By depositing in a state heated in this manner, the stability of a device when made to operate, for example, in a 60° C. constant temperature can be increased.

If substrate temperature during deposition is higher than the PC substrate distortion temperature (150° C.), variation in TFT device properties (gate voltage V$_{GS}$ threshold value or I$_{DS}$ etc.) increases.

By using the amorphous oxide according to the present invention for a channel layer, a transistor, and in particular, a normally-off type FET, can be realized.

Such a transistor can be employed as a switching device for a liquid crystal display (LCD) or an organic EL display.

In addition, since the amorphous oxide can be formed on a flexible substrate including plastic films, the present invention can be broadly applied in such products as flexible displays as well as IC cards, ID tags and other devices.

This application claims priority from Japanese Patent Application No. 2004-326686 filed on Nov. 10, 2004, which is hereby incorporated by reference herein.

What is claimed is:

1. A method of manufacturing a field-effect transistor comprising:
    a first step of preparing a substrate; and
    a second step of forming on the substrate an insulating layer or an active layer comprising an amorphous oxide semiconductor comprising one element of at least In, Zn and Sn,
    (A) wherein the second step is conducted in an atmosphere of at least one of (i) ozone gas, (ii) nitrogen oxide gas, (iii) oxygen radical, (iv) elemental oxygen, (v) oxygen plasma, or (vi) oxygen ion, at an oxygen partial pressure sufficient to reduce electron carrier density of said amorphous oxide semiconductor to less than $1 \times 10^{18}$ cm$^3$, and wherein
        (a) the atmosphere of (i) ozone gas is generated by supplying the ozone gas (i) to a deposition chamber by generating the ozone gas (i) by means of supplying oxygen to an ozone generating device in the deposition chamber,
        (b) the atmosphere of (ii) nitrogen oxide gas is generated by supplying the nitrogen oxide gas (ii) to the deposition chamber from outside the deposition chamber,
        (c) the atmosphere of oxygen radical (iii)-containing gas or elemental oxygen (iv)-containing gas is generated by supplying the oxygen radical (iii)-containing gas or the elemental oxygen (iv)-containing gas to the deposition chamber by generating the oxygen radical (iii)-containing gas or the elemental oxygen (iv)-containing gas by means of supplying oxygen to a radical or elemental oxygen generating device spaced within or outside the deposition chamber; and (d) the atmosphere of oxygen plasma (v) or oxygen ion (vi) is generated by: irradiating the substrate with plasma beam or oxygen ion-containing ion beam; or by supplying oxygen to a plasma or elemental oxygen generating device spaced within or outside the deposition chamber, or (B) wherein after the second step is conducted to form the amorphous oxide semiconductor, oxygen partial pressure is controlled to reduce said electron carrier density to less than $1 \times 10^{18}$ cm$^3$ in an atmosphere of at least one of said (i)-(vi) generated by one said steps (a)-(d), respectively.

2. A method of manufacturing a field-effect transistor comprising:

a first step of preparing a substrate;

a second step of depositing on the substrate an insulating layer or an active layer comprising an amorphous oxide semiconductor comprising one element selected from at least In, Zn and Sn; and a third step of thermal processing, at a higher temperature than a deposition temperature of the active layer or the insulating layer in the second step, in an atmosphere of water vapor, wherein the atmosphere of water vapor is saturated water vapor pressure.

3. A method of manufacturing a field-effect transistor according to claim 2, wherein the temperature of the thermal processing is higher than the deposition temperature of the active layer or the insulating layer, and is not more than 200° C.

* * * * *